(12) United States Patent
Uchiyama et al.

(10) Patent No.: US 8,264,758 B2
(45) Date of Patent: Sep. 11, 2012

(54) SPRING, MIRROR DEVICE, MIRROR ARRAY, AND OPTICAL SWITCH

(75) Inventors: Shingo Uchiyama, Kanagawa (JP); Makoto Sato, Kanagawa (JP); Fusao Shimokawa, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 617 days.

(21) Appl. No.: 12/085,487

(22) PCT Filed: Dec. 26, 2006

(86) PCT No.: PCT/JP2006/325914
§ 371 (c)(1),
(2), (4) Date: Oct. 12, 2009

(87) PCT Pub. No.: WO2007/074821
PCT Pub. Date: Jul. 5, 2007

(65) Prior Publication Data
US 2010/0033856 A1     Feb. 11, 2010

(30) Foreign Application Priority Data
Dec. 26, 2005 (JP) .................................. 2005-372263

(51) Int. Cl.
*G02B 26/08* (2006.01)
(52) U.S. Cl. .................................................. 359/224.1
(58) Field of Classification Search .... 359/223.1–226.1, 359/290, 291, 872
See application file for complete search history.

(56) References Cited

U.S. PATENT DOCUMENTS

| | | | |
|---|---|---|---|
| 6,995,499 B2 * | 2/2006 | Hwang | 359/224.1 |
| 2006/0061850 A1 * | 3/2006 | Fu et al. | 359/224.1 |

FOREIGN PATENT DOCUMENTS

| | | |
|---|---|---|
| JP | 2002-162581 A | 6/2002 |
| JP | 2003-057575 A | 2/2003 |
| JP | 2004-240011 A | 8/2004 |
| JP | 2005-517990 A | 6/2005 |
| JP | 2006-039066 A | 2/2006 |
| WO | WO 2005/085125 A1 | 9/2005 |

OTHER PUBLICATIONS

Yamaguchi et al., "Characteristics and Control of MEMS Mirrors for Optical Cross-Connecto Switch", MIPE 2003.
Ishii et al., "Fabrication of Optical MEMS Switch Having Multilevel Mirror-Drive Electrodes", IEEE 2003, pp. 121-122.
Ishii et al., "Fabrication of Optical Microelectromechanical-System Switches Having Multilevel Mirror-Drive Electrodes", Japanese Journal of Applied Physics, vol. 43, No. 9A, 2004, pp. 6468-6472.

* cited by examiner

*Primary Examiner* — Euncha Cherry
(74) *Attorney, Agent, or Firm* — Blakely, Sokoloff, Taylor & Zafman

(57) ABSTRACT

A total length of members (11, 13, 15, 17, 19, 21, 23, 25) formed in an X-axis direction of a spring (1) is larger than a spring length of the spring (1) and larger than a total length of members (12, 14, 16, 18, 20, 22, 24) formed in a Y-axis direction. With this arrangement, spring constants of respective axes can be increased, and a spring constant in a direction R can be set appropriately and freely within a wider range.

19 Claims, 14 Drawing Sheets

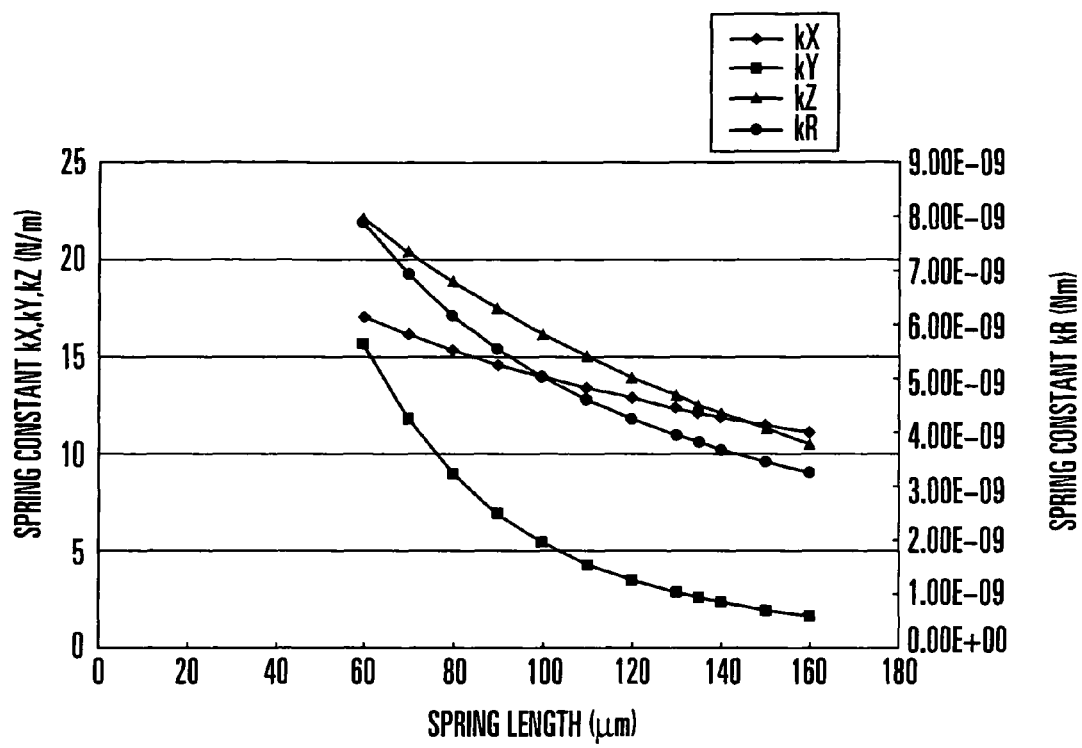
F I G. 2
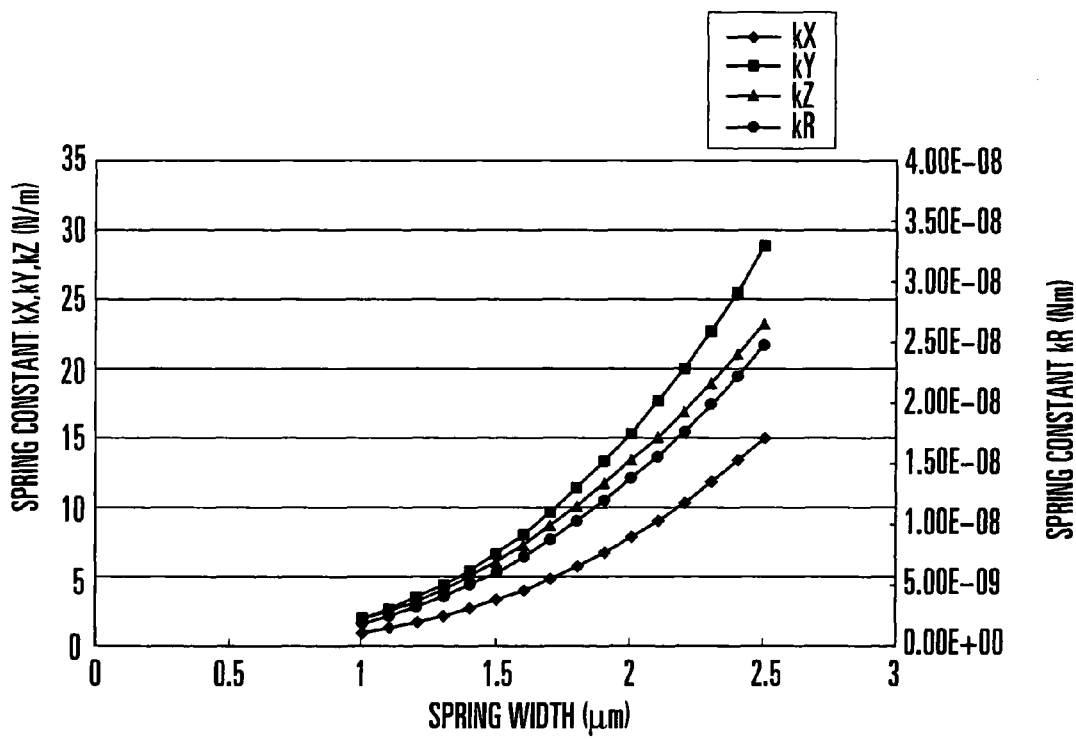
F I G. 3

| | SPRING LENGTH [μm] | SPRING WIDTH [μm] | SPRING THICKNESS [μm] | SPRING PITCH | SIDE SPRING RATIO |
|---|---|---|---|---|---|
| FIG. 2 | VARIABLE | 1.5 | 10 | 10 | 9 |
| FIG. 3 | 90 | VARIABLE | 10 | 20 | 13 |
| FIG. 4 | 80 | 1.5 | 10 | 10 | VARIABLE |
| FIG. 5 | 80 | 1.5 | 10 | VARIABLE | 9 |

SPRING, MIRROR DEVICE, MIRROR ARRAY, AND OPTICAL SWITCH

The present patent application is a non-provisional application claiming the benefit of International Application No. PCT/JP2006/325914, filed Dec. 26, 2006.

TECHNICAL FIELD

The present invention relates to a MEMS (Micro Electro Mechanical System) and, more particularly, to a mirror device applicable to an optical switch, and a spring applicable to the mirror device or the like.

BACKGROUND ART

In the field of the optical network serving as the base in the Internet communication network and the like, the optical MEMS (Micro Electro Mechanical System) technique attracts attention as a technique that realizes a multichannel, wavelength division multiplex (WDM), low-cost system, and an optical switch has been developed using this technique (for example, see Japanese Patent Laid-Open No. 2003-57575). One of the most characteristic constituent components of the MEMS type optical switch is a mirror array. In the mirror array, a plurality of mirror devices are arranged two-dimensionally to form a matrix. FIG. 21 shows an example of a conventional mirror device comprising one mirror to serve as one constituent unit of a mirror array.

A mirror device 7000 has a structure in which a mirror substrate 8000 having a mirror 830 and an electrode substrate 9000 having electrodes 940a to 940d are arranged parallel to each other to oppose each other.

The mirror substrate 8000 comprises a plate-like frame portion 810 having an opening which is almost circular when seen from the top, a gimbal 820 disposed in the opening of the frame portion 810 by a pair of gimbal connectors 811a and 811b and having an opening which is almost circular when seen from the top, and the mirror 830 which is disposed in the opening of the gimbal 820 by a pair of mirror connectors 821a and 821b and almost circular when seen from the top. A frame-like member 840 surrounding the gimbal 820 and mirror 830 is arranged on the upper surface of the frame portion 810.

The electrode substrate 9000 has a plate-like base 910 and a conical projection 920 which projects from the surface (upper surface) of the base 910 and is formed at a position opposing the mirror 830 of the mirror substrate 8000. The four fan-shaped electrodes 940a to 940d are formed on the outer surface of the projection 920 and the upper surface of the base 910 to fall within a circle concentric with the mirror 830 of the opposing mirror substrate 8000. A pair of protrusions 960a and 960b which line up to sandwich the projection 920 are formed on the upper surface of the base 910. Furthermore, interconnections 970 are formed between the projection 920 and protrusion 960a and between the projection 920 and protrusion 960b on the upper surface of the base 910. The interconnections 970 are connected to the electrodes 940a to 940d through lines 941a to 940d.

The mirror substrate 8000 and electrode substrate 9000 as described above constitute the mirror device 7000 as the lower surface of the frame portion 810 is bonded to the upper surfaces of the protrusions 960a and 960b such that the mirror 830 opposes the electrodes 940a to 940d that oppose it.

In the mirror device 7000, voltages are separately applied to the electrodes 940a to 940d through the interconnections 970, so that electric fields formed by the potential differences between the mirror 830 and the electrodes 940a to 940d apply electrostatic attracting forces to the mirror 830. This elastically deforms the gimbal connectors 811a and 811b and mirror connectors 821a and 821b to tilt the mirror 830 through an angle of several degrees. This operation can be described as follows by referring to FIG. 22. When no voltage is applied to the electrodes 940a to 940d, the mirror 830 is in a state (to be referred to as an initial position hereinafter) of almost parallel to the electrode substrate 9000, as indicated by a solid line in FIG. 22. In this state, when a voltage is applied to, e.g., the electrode 940a, the gimbal 820 and mirror 830 pivot about a pivot axis extending through the gimbal connectors 811a and 811b and a pivot axis extending through the mirror connectors 821a and 821b, respectively, to tilt as indicated by a broken line in FIG. 22. To effect this tilting operation smoothly, springs, that is, the gimbal connectors 811a and 811b and mirror connectors 821a and 821b employ a structure that enables them to pivot easily in a direction (to be referred to as a direction R hereinafter) about an axis (to be referred to as a pivot axis or X-axis hereinafter) that connects one connecting point (the stationary frame 810 or gimbal 820) and the other connecting point (the gimbal 820 or mirror 830).

For example, as shown in FIGS. 21 and 23, the conventional mirror device 7000 employs a spring with a serpentine-shaped structure that flexes repeatedly in a direction perpendicular to the X-axis direction. Among parameters representing the serpentine structure, the length in the direction (to be referred to as the Z-axis direction hereinafter) perpendicular to the X-axis and the major surface of the mirror 830, the length in the direction of the pivot axis, the number of folds, the length in the direction (to be referred to as the Y-axis direction hereinafter) perpendicular to the X-axis and Z-axis, the gaps among the folding portions, and the like are the parameters that determine the characteristics such as the spring constant of the spring. By appropriately setting these parameters, the elastic characteristics, particularly spring constants in the direction R, of the gimbal connectors 811a and 811b and mirror connectors 821a and 821b take desired values.

DISCLOSURE OF INVENTION

Problem to be Solved by the Invention

However, when the spring has a serpentine structure, if the spring coefficients in the direction R are set to desired values, spring constants become small in directions parallel to the X-, Y-, and Z-axes, making it difficult to obtain desired characteristics. As a result, in the manufacturing process of a device having a serpentine-structure spring, if heat, stress, surface tension, shock, vibration, or the like occurs, it may break the spring, or the spring may stick to an adjacent structure. This phenomenon occurs not only in the device manufacturing process but also in the test or actual use of a finished device. Hence, a spring that can easily provide desired characteristics has been sought for so that it will not be broken or stick to an adjacent structure in the manufacturing process or use process.

The present invention has been made to solve the problem described above, and has its object to provide a spring that can be formed easily to have desired characteristics, a mirror device having the spring, a mirror array comprising the mirror devices, and an optical switch having the mirror array.

Means of Solution to the Problem

In order to achieve the above object, according to the present invention, there is provided a spring characterized by comprising an elongated member including a pair of ends and made of an elastic material, and a plurality of bending portions which are formed between the pair of ends and divide the elongated member into a plurality of elements, wherein a total length of elements parallel to an axis extending through the pair of ends is larger than a gap between the ends in a no-load state. Note that the number of elements is n+1 where n is the number of bending portions.

According to the present invention, there is also provided a mirror device including a substrate, a frame member disposed spaced apart from the substrate to be substantially parallel thereto, a mirror supported in an opening of the frame member to be pivotal through a spring, and an electrode formed at a position on the substrate to oppose the mirror, characterized in that the spring comprises an elongated member including a pair of ends and made of an elastic material, and a plurality of bending portions which are formed between the pair of ends and divide the elongated member into a plurality of elements, and a total length of elements parallel to an axis extending through the pair of ends is larger than a gap between the ends in a no-load state.

According to the present invention, there is also provided a mirror array formed by two-dimensionally arranging a plurality of mirror devices each comprising a substrate, a frame member disposed spaced apart from the substrate to be substantially parallel thereto, a mirror supported in an opening of the frame member to be pivotal through a spring, and an electrode formed at a position on the substrate to oppose the mirror, characterized in that the spring comprises an elongated member including a pair of ends and made of an elastic material, and a plurality of bending portions which are formed between the pair of ends and divide the elongated member into a plurality of elements, and a total length of elements parallel to an axis extending through the pair of ends is larger than a gap between the ends in a no-load state.

According to the present invention, there is also provided an optical switch including a first mirror array which reflects light from an input port, and a second mirror array which reflects the light from the first mirror array and guides the light to an output port, characterized in that each of the first mirror array and the second mirror array comprises a mirror array formed by two-dimensionally arranging a plurality of mirror devices each comprising a substrate, a frame member disposed spaced apart from the substrate to be substantially parallel thereto, a mirror supported in an opening of the frame member to be pivotal through a spring, and an electrode formed at a position on the substrate to oppose the mirror, and the spring comprises an elongated member including a pair of ends and made of an elastic material, and a plurality of bending portions which are formed between the pair of ends and divide the elongated member into a plurality of elements, and a total length of elements parallel to an axis extending through the pair of ends is larger than a gap between the ends in a no-load state.

Effect of the Invention

According to the present invention, since the total length of the elements having parallel axes is set to be larger than the gap between the ends in a no-load state, spring constants about axes can be decreased, and spring constants in other directions do not decrease because of the layout and shapes of other members as well. Therefore, the spring, mirror device, mirror array, and optical switch can be formed easily to have desired characteristics.

BRIEF DESCRIPTION OF DRAWINGS

FIG. 2 is a graph showing the relationship between a spring length and spring constant;

FIG. 3 is a graph showing the relationship between a spring width and spring constant;

BEST MODE FOR CARRYING OUT THE INVENTION

The embodiments of the present invention will be described in detail with reference to the drawings.

[Spring]

Figure 1A:
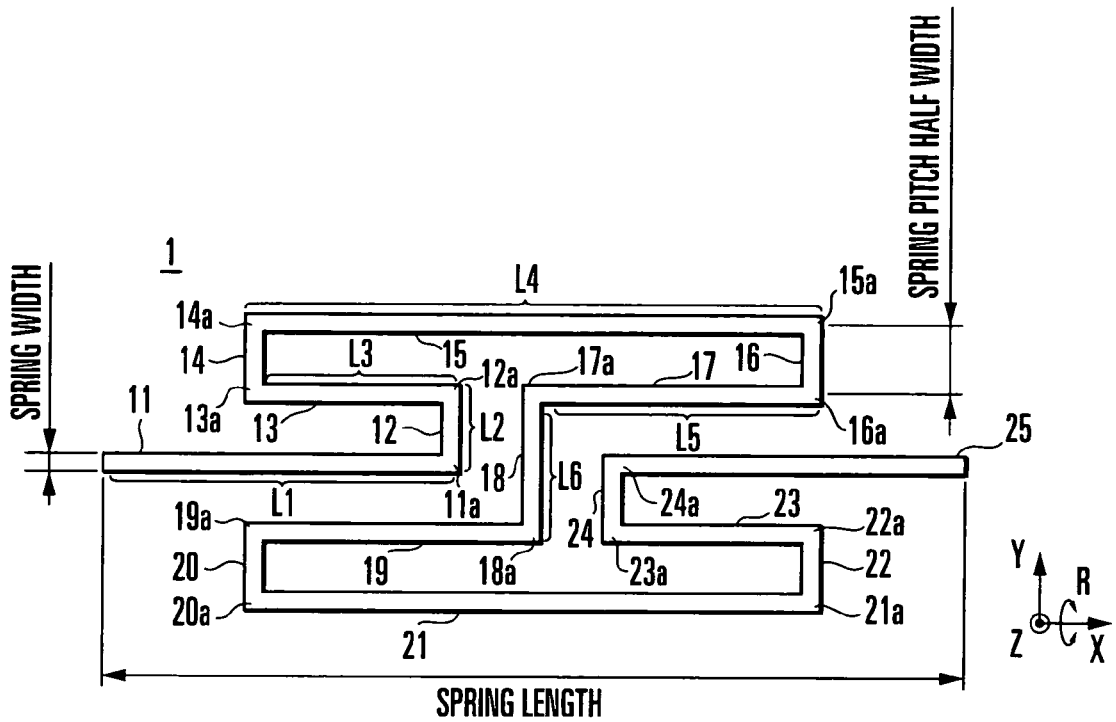
FIG. 1A is a plan view schematically showing a spring of the present invention.
Figure 1B:
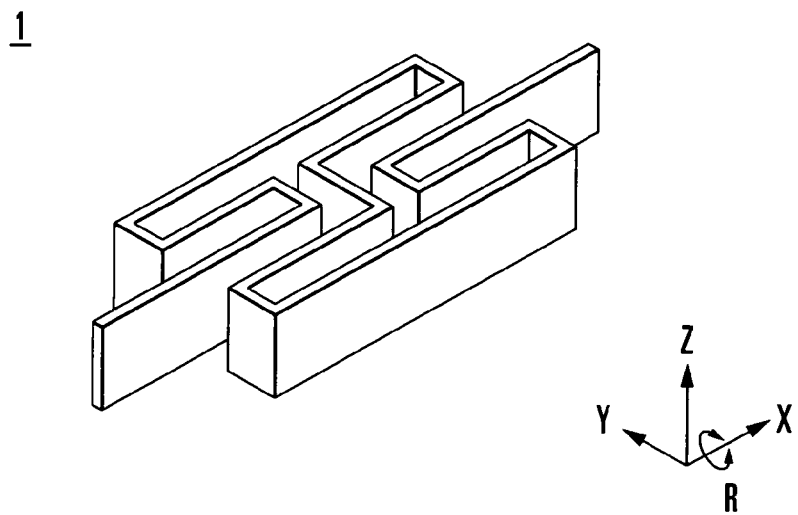
FIG. 1B is a perspective view schematically showing the spring of the present invention.
Figure 4:
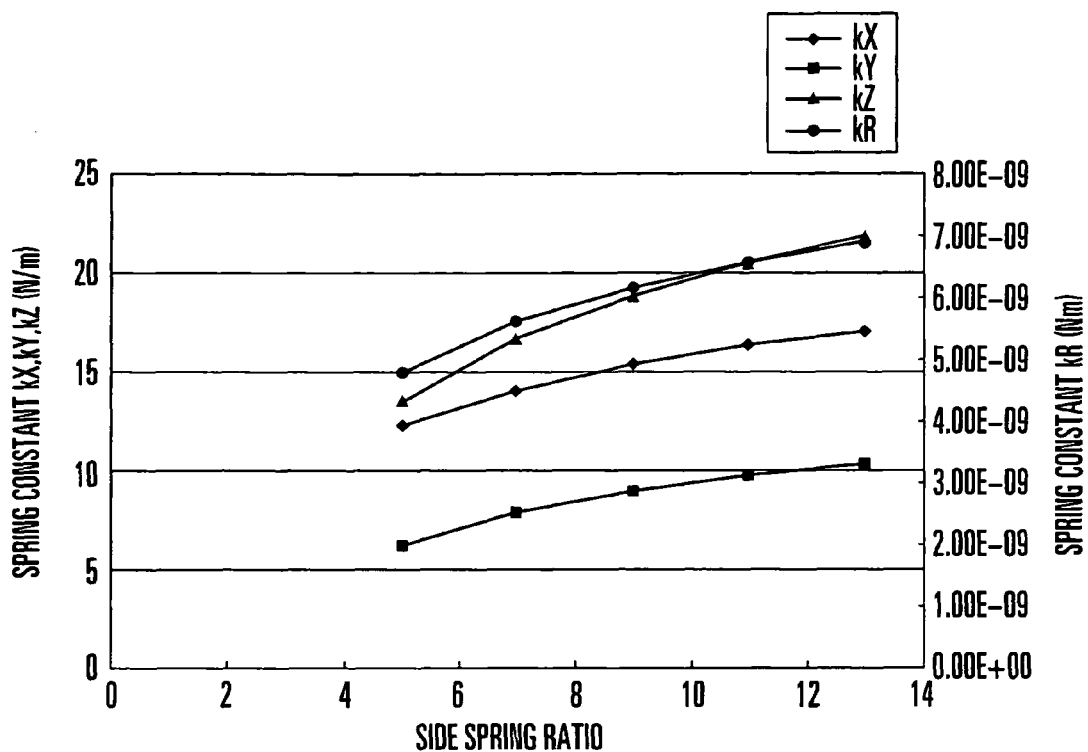
FIG. 4 is a graph showing the relationship between a side spring ratio and spring constant.

As shown in FIGS. 1A and 1B, a spring 1 according to this embodiment is formed of an elastic member. The section of the spring 1 in a direction perpendicular to the X-axis or Y-axis direction has an almost rectangular shape, so that the spring 1 has an almost H planar shape obtained by forming almost rectangular shapes to be symmetric about the pivot axis. In such a spring 1, a member 11 is connected to one member and a member 25 is connected to another member, thus connecting one member to another member. In the following description, the connection direction of one connection point and the other connection point connected by the spring 1 will be referred to as the "pivot-axis direction" or "X-axis direction", the widthwise direction of the spring 1, that is, a direction perpendicular to the X-axis direction within a plane including the spring 1 will be referred to as the "Y-axis direction", the direction of thickness of the spring 1, i.e., the direction perpendicular to the X-axis direction and Y-axis direction will be referred to as the "Z-axis direction", and the direction in which the structure connected to the spring 1 is pivoted, that is, the direction about the X-axis will be referred to as the "pivotal direction" or "direction R".

The planar shape of the spring 1 will be described in more detail. As shown well in FIG. 1A, in the spring 1, the members 11 to 25 serving as elements are continuously connected to each other through bending portions 11a to 24a, thus forming an almost H shape when seen from the top. The members 11 to 25 respectively have almost square beam shapes when seen from the top and are arranged in the following manner. In the following description, the distance of each member refers to the length of a line segment that corresponds to each member when the spring is straightened, in other words, the length of the central line of each member along a direction in which each member is connected.

The member 11 is formed to extend from one end where it is connected to one member for a distance L1 in the positive direction along the X-axis. The member 12 is formed to extend from one end where it is connected to the bending portion 11a at the other end of the member 11 for a distance L2 in the positive direction along the Y-axis. The member 13 is formed to extend from one end where it is connected to the bending portion 12a at the other end of the member 12 for a distance L3 (L1>L3) in the negative direction along the X-axis. The member 14 is formed to extend from one end where it is connected to the bending portion 13a at the other end of the member 13 for the distance L2 in the positive direction along the Y-axis. The member 15 is formed to extend from one end where it is connected to the bending portion 14a at the other end of the member 14 for a distance L4 (L4>L3) in the positive direction along the X-axis.

The member 16 is formed to extend from one end where it is connected to the bending portion 15a at the other end of the member 15 for the distance L2 in the negative direction along the Y-axis. The member 17 is formed to extend from one end where it is connected to the bending portion 16a at the other end of the member 16 for a distance L5 (L4>L5>L3, (L4−L3)>L5) in the negative direction along the X-axis. The member 18 is formed to extend from one end where it is connected to the bending portion 17a at the other end of the member 17 for a distance L6 (L6≈2L2) in the negative direction along the Y-axis. The member 19 is formed to extend from one end where it is connected to the bending portion 18a at the other end of the member 18 for the distance L5 in the negative direction along the X-axis. The member 20 is formed to extend from one end where it is connected to the bending portion 19a at the other end of the member 19 for the distance L2 in the negative direction along the Y-axis.

The member 21 is formed to extend from one end where it is connected to the bending portion 20a at the other end of the member 20 for the distance L4 in the positive direction along the X-axis. The member 22 is formed to extend from one end where it is connected to the bending portion 21a at the other end of the member 21 for the distance L2 in the positive direction along the Y-axis. The member 23 is formed to extend from one end where it is connected to the bending portion 22a at the other end of the member 22 for the distance L3 in the negative direction along the X-axis. The member 24 is formed to extend from one end where it is connected to the bending portion 23a at the other end of the member 23 for the distance L2 in the positive direction along the Y-axis. The member 25 is formed to extend from one end where it is connected to the bending portion 24a at the other end of the member 24 for the distance L1 in the positive direction along the X-axis.

As shown in FIG. 1A, the total length of the members 11, 13, 15, 17, 19, 21, 23, and 25 formed in the X-axis direction of the spring 1 is larger than the spring length of the spring 1, and larger than the total length of the members 12, 14, 16, 18, 20, 22, and 24 formed in the Y-axis direction of the spring 1. The total length refers to the length obtained by connecting the respective members in a line in the longitudinal direction, in other words, in the X-axis direction or Y-axis direction. The lengths of the whole spring 1 (to be referred to as the "spring length" hereinafter) refers to the distance between the two members connected by the spring 1, that is, the gap between the two ends of the spring 1 in a no-load state. Although the members 12 and 14, and 2 and 24 have the same lengths, they may have different lengths. Similarly, the members 11 and 25 may have different lengths.

The lengths of the members 11 to 25 can be set appropriately and freely such that the lengths of all the members differ or the axis of the member 11 does not coincide with that of the member 25, as far as each of the members 11 to 25 is spaced apart from any member parallel to it. Hence, at least the members 11 and 19, the members 12 and 18, the members 17 and 25, and the members 18 and 24 are formed to be spaced apart from each other.

The spring 1 having such a shape has, as parameters that determine the characteristics such as a spring constant, the spring length, the spring width, the total length of the members formed parallel to the X-axis, the total length of the members formed parallel to the Y-axis, the spring thickness, the spring pitch, the side spring ratio, and the like. The spring thickness refers to the length of the spring 1 in the Z-axis direction. The spring pitch refers to the gap between members parallel to the X-axis. The side spring ratio refers to the ratio of the length of a member (the member 15 or 21) parallel to the X-axis direction to the spring length.

As an example, FIGS. 2 to 5 show the relationships between the spring length and the spring constant, the spring width and the spring constant, the side spring ratio and the spring constant, and the spring pitch and the spring constant, respectively and the spring constant. In each of FIGS. 2 to 5, the axis of abscissa represents the spring length, spring width, side spring ratio, or spring pitch. The left axis of ordinate represents the value of the spring constant in the X-axis direction, Y-axis direction, or Y-axis direction, and the right axis of ordinate represents the value of the spring constant in the direction R. Black rhombuses represent spring constants kX in the X-axis direction, black rectangles represent spring constants kY in the Y-axis direction, black triangles represent spring constants kZ in the Z-axis direction, and black circles represent spring constants kR in the direction R. FIG. 6 shows the shapes of the spring 1 when the measurement results of FIGS. 2 to 5 are obtained. In FIG. 6, the side spring ratio is calculated by [spring length−{(spring length)−(length of member 11)−(length of member 25)}]/(length of member 13).

As shown in FIGS. 2 to 5, each spring constant changes differently depending on the parameters. For example, regarding the spring length shown in FIG. 2, as the spring length increases, the spring constant decreases. Regarding the spring width shown in FIG. 3, as the spring width increases, the spring constant increases. Regarding the side spring ratio shown in FIG. 4, as the side spring ratio increases, the spring constant increases. Regarding the spring pitch shown in FIG.

5, as a whole, as the spring pitch increases, the spring constant decreases, but with a different degree depending on the spring constants.

As the characteristics of the change in spring constant differs among the parameters in this manner, if the respective parameters are set appropriately, the spring constants of the spring 1 in the respective directions can be set at desired values appropriately and freely.

According to this embodiment, when the spring constant in the direction R is set small, the spring constants in the respective directions can be set to be larger than those of a serpentine-shaped spring. This is because the spring constant in the direction R largely depends on the length of a member formed in the direction of the pivot axis, that is, in the X-axis direction. The member formed in the X-axis direction corresponds to, e.g., the member 11, 13, 15, 17, 19, 21, 23, or 25 in FIG. 1A.

In a microstructure such as a MEMS, the spring constant in the direction R is caused largely by the torsion of the spring rather than the flex of the spring. Hence, in a spring such as a conventional serpentine-shaped spring which is formed under an assumption that it is to be pivoted by flexing, the spring constant in the direction R cannot be decreased by increasing the length of the folding portion or the like while keeping the large spring constants in the respective axial directions unchanged. In the conventional serpentine-shaped spring, the length in the X-axis direction is restricted. More specifically, as the length of the spring in the X-axis direction cannot be larger than the length of the spring as a whole, it is difficult to set the spring constant in the direction R appropriately and freely within a wide range.

In contrast to this, according to the present invention, the spring has an almost H shape including a plurality of reciprocations in the X direction to increase the length of the members in the X-axis direction, so that the spring can easily be twisted about the X-axis, in other words, the spring constant in the direction R decreases. This allows the spring constant in the direction R to be set appropriately and freely within a wide range without decreasing the spring constants in the X-, Y-, and X-axis directions to be lower than in the conventional spring. In particular, according to this embodiment, the total length of the members with axes parallel to the X-axis direction of the spring 1 is larger than the total length of the members with axes parallel to the Y-axis direction. Therefore, the spring constants in the respective axes can be increased, and the spring constant in the direction R can be set appropriately and freely within a wider range.

According to this embodiment, a plurality of members parallel to the X-axis direction are disposed in the Y-axis direction, so that a large number of axes of the members parallel to the X-axis can be formed. In the conventional serpentine-shaped spring, only two axes in the longitudinal direction of the members parallel to the X-axis are formed. In spring 1 of this embodiment, four axes (the axis of the member 15, the axis of the members 13 and 17, the axis of the members 19 and 23, and the axis of the member 21) are formed. When the large number of axes parallel to the X-axis direction are formed in this manner, torsion occurs in a plurality of axes, so that the spring constant in the direction R can be decreased.

Figure 8:
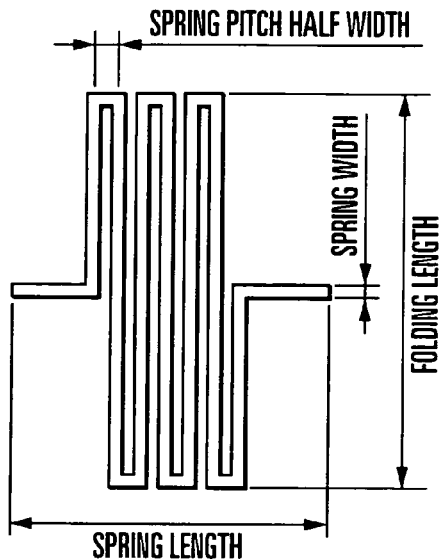
FIG. 8 is a view to explain the shape of the conventional spring.

As an example, the spring 1 of this embodiment will be compared with the conventional serpentine-shaped spring. FIGS. 3 and 7 are graphs each showing the relationship between the spring width and spring constant. FIG. 7 shows values calculated on the basis of the spring shown in FIG. 8. The spring shown in FIG. 8 has a number of folds of 6, a spring pitch half width of 8 µm, a spring width of 1.5 µm, a spring thickness of 10 µm, a folding length of 158.5 µm, and a spring length of 135 µm.

The value of the spring constant of the spring 1 in each of the X-, Y-, and Z-axis directions of this embodiment shown in FIG. 3 is about 10 to several thousand times larger than the value of the corresponding spring constant of the conventional spring shown in FIG. 7. This is because the length of the members of the spring 1 of this embodiment with axes along the X-axis direction is larger than that in the conventional spring, and the length of the members along the Y-axis direction is smaller than that in the conventional spring, as described above. Therefore, according to this embodiment, even when the value of the spring constant in the direction R is decreased, the values of the spring constants in the directions of the respective axes can be increased. This can prevent the spring from being broken or sticking to another member.

Figure 5:
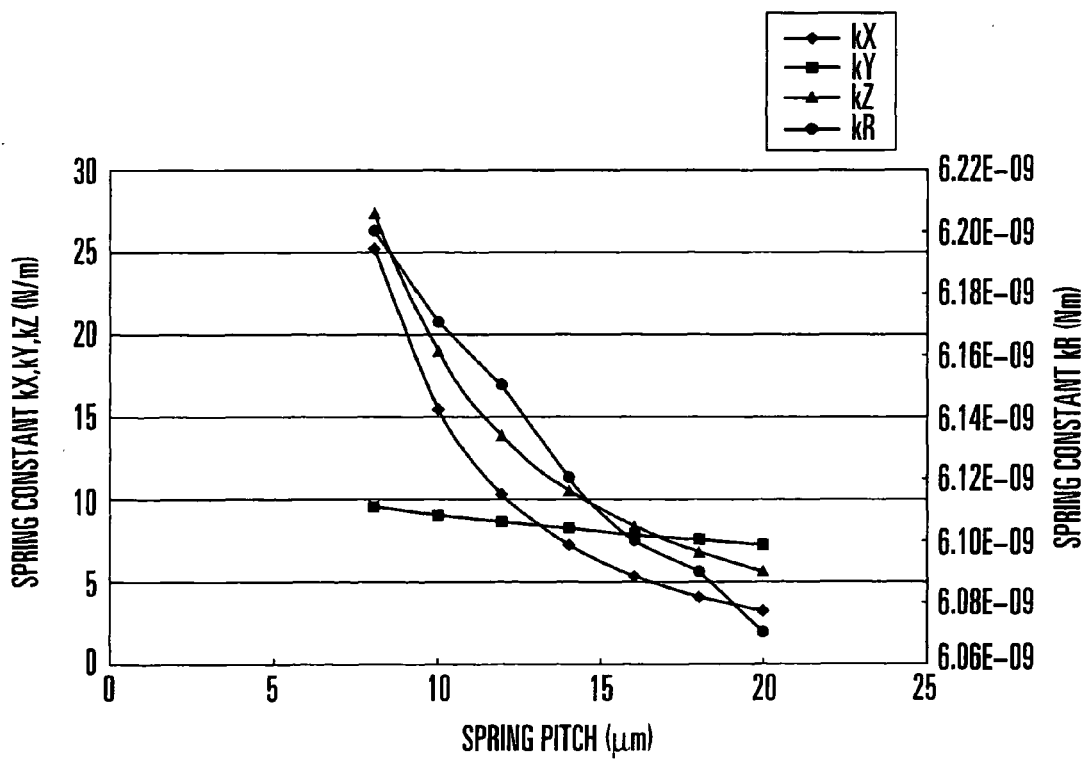
FIG. 5 is a graph showing the relationship between a spring pitch and spring constant.
Figures 6, 7:
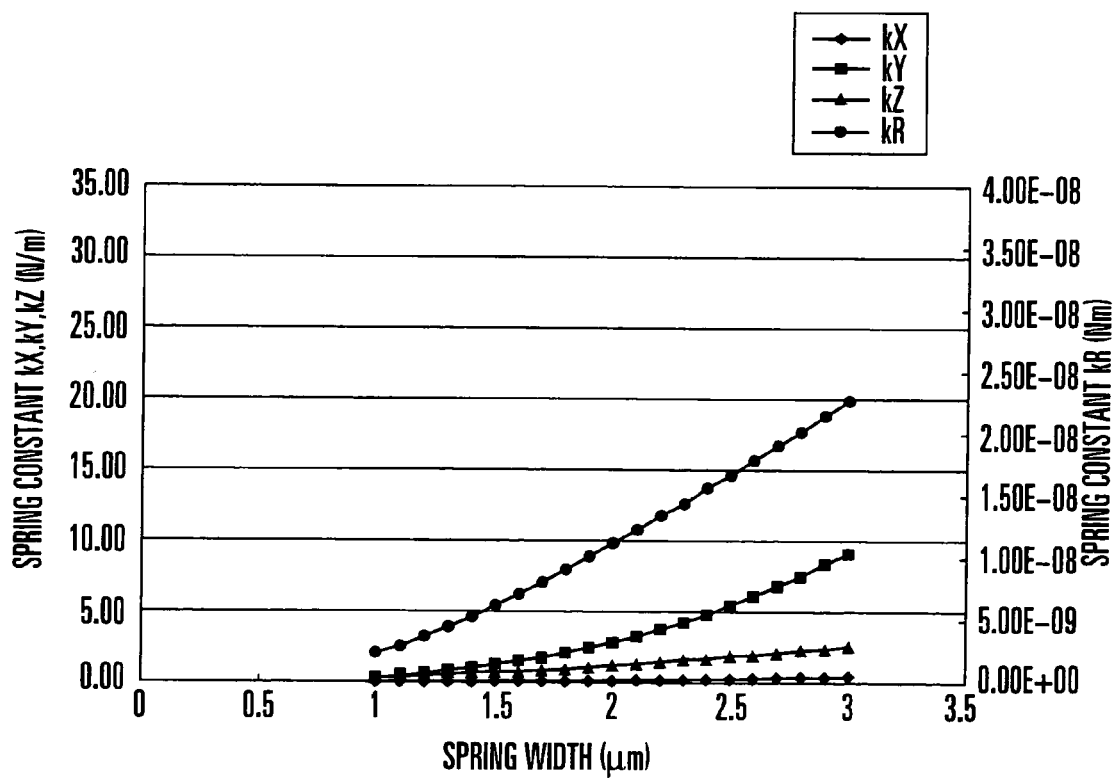
FIG. 6 is a table explaining the shapes of springs when the measurement results in FIGS. 2 to 5 are obtained.
FIG. 7 is a graph showing the relationship between the spring width and spring constant of a conventional spring.
Figure 9:
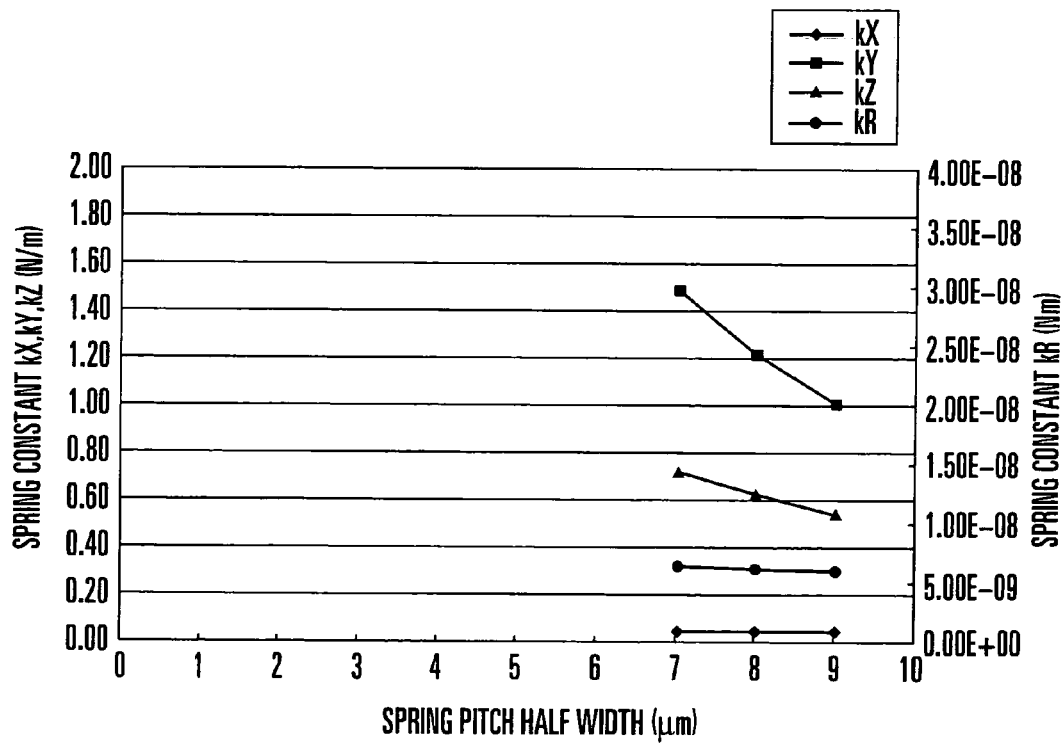
FIG. 9 is a graph showing the relationship between the spring pitch half width and spring constant of the conventional spring.

The spring 1 of this embodiment will be compared with the conventional serpentine-shaped spring by referring to FIGS. 5 and 9. FIG. 5 is a graph showing the relationship between the spring pitch and spring constant, and FIG. 9 is a graph showing the relationship between the half spring pitch (the length half the spring pitch) and the spring constant. The values in FIG. 9 are also obtained by calculation on the basis of the spring shown in FIG. 8. The spring shown in FIG. 9 has a number of folds of 6, a spring width of 1.5 µm, a spring thickness of 10 µm, a folding length of 160 µm, and a spring length of 135 µm.

In the spring 1 of the embodiment shown in FIG. 5, the values of the spring constants in the respective axes are larger than those of the conventional spring shown in FIG. 9. Even when the value of the spring constant in the direction R is decreased, the values of the spring constants in the directions of the respective axes can be increased. This can prevent the spring from being broken or sticking to another member. When the spring pitch is changed, the spring constant of the spring 1 of this embodiment changes much larger than that of the conventional spring. Therefore, the spring constants of the spring 1 in the respective directions can be set at desired values appropriately and freely within a wide range.

Figure 10A:
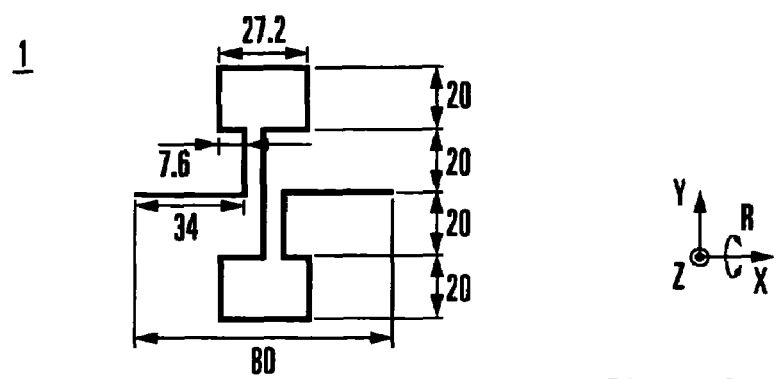
FIG. 10A is a plan view showing an example of a spring 1.
Figure 10B:
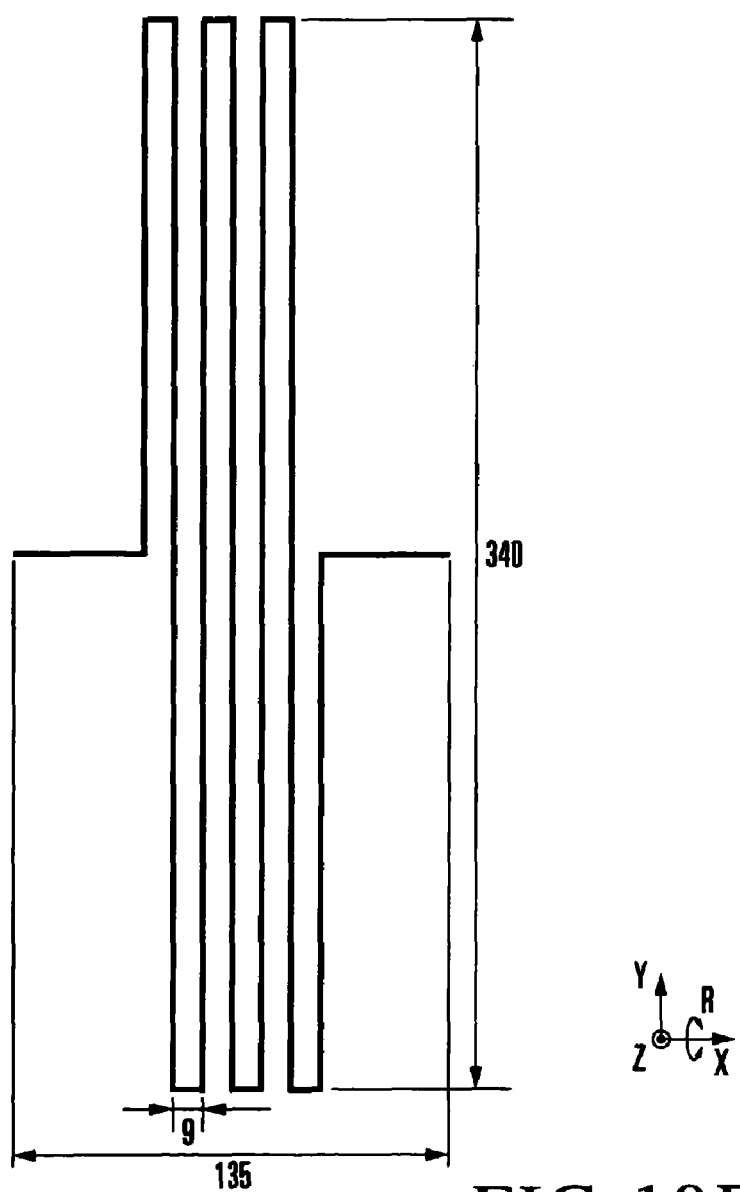
FIG. 10B is a plan view showing an example of the conventional spring.

According to this embodiment, when the spring constant in the direction R is the same, the spring can be formed to be smaller than the conventional serpentine-shaped spring. As an example, FIGS. 10A and 10B respectively show the spring 1 of this embodiment and the conventional serpentine-shaped spring which have the same spring constant in the direction R if the spring widths and spring thicknesses are the same. In each of FIGS. 10A and 10B, the unit of numerical values is µm, and the spring thickness is 10 µm and the spring width is 1.4 µm. FIGS. 10A and 10B are drawn with the same scale.

The spring 1 of this embodiment shown in FIG. 10A has a spring length of 80 µm, a side spring ratio of 9, and a spring length of 20 µm. This spring 1 has a spring constant of $4.99 \times 10^{-9}$ in the direction R, a spring constant kX of 2.57 in the X-axis direction, a spring constant kY of 5.86 in the Y-axis direction, and a spring constant kZ of 4.63 in the Z-axis direction.

If the same spring constant in the direction R as that of the spring 1 of this embodiment is to be realized with the conventional serpentine-shaped spring shown in FIG. 10B, the conventional serpentine-shaped spring must have a spring length of 135 µm, a spring pitch of 9 µm, and a folding length of 340 µm. If the spring 1 of this embodiment and the conventional spring are to be held in rectangular regions, respectively, although the former can be held in a region of 80 µm×80 µm, the latter requires a region of 135 µm×340 µm. This value is as much as about 7.2 times that of the spring 1 of this embodiment. In this manner, by using the spring 1 of this embodiment, the area required for the spring can be decreased. This achieves a higher degree of integration and downsizing of the device on which the spring 1 is to be mounted.

Regarding the spring constants of the conventional spring in the directions of the respective axes, a spring constant kX in the X-axis direction is 0.03, a spring constant kY in the Y-axis direction is 0.78, and a spring constant kZ in the Z-axis direction is 0.40, each of which is smaller than the corresponding spring constant of the spring 1 of this embodiment. In this manner, in the spring 1 of this embodiment, even when it is downsized, the spring constants in the directions of the respective axes can be increased. As a result, the spring constants of the spring 1 in the respective directions can be set at desired values appropriately and freely.

[Mirror Array]

Figure 11:
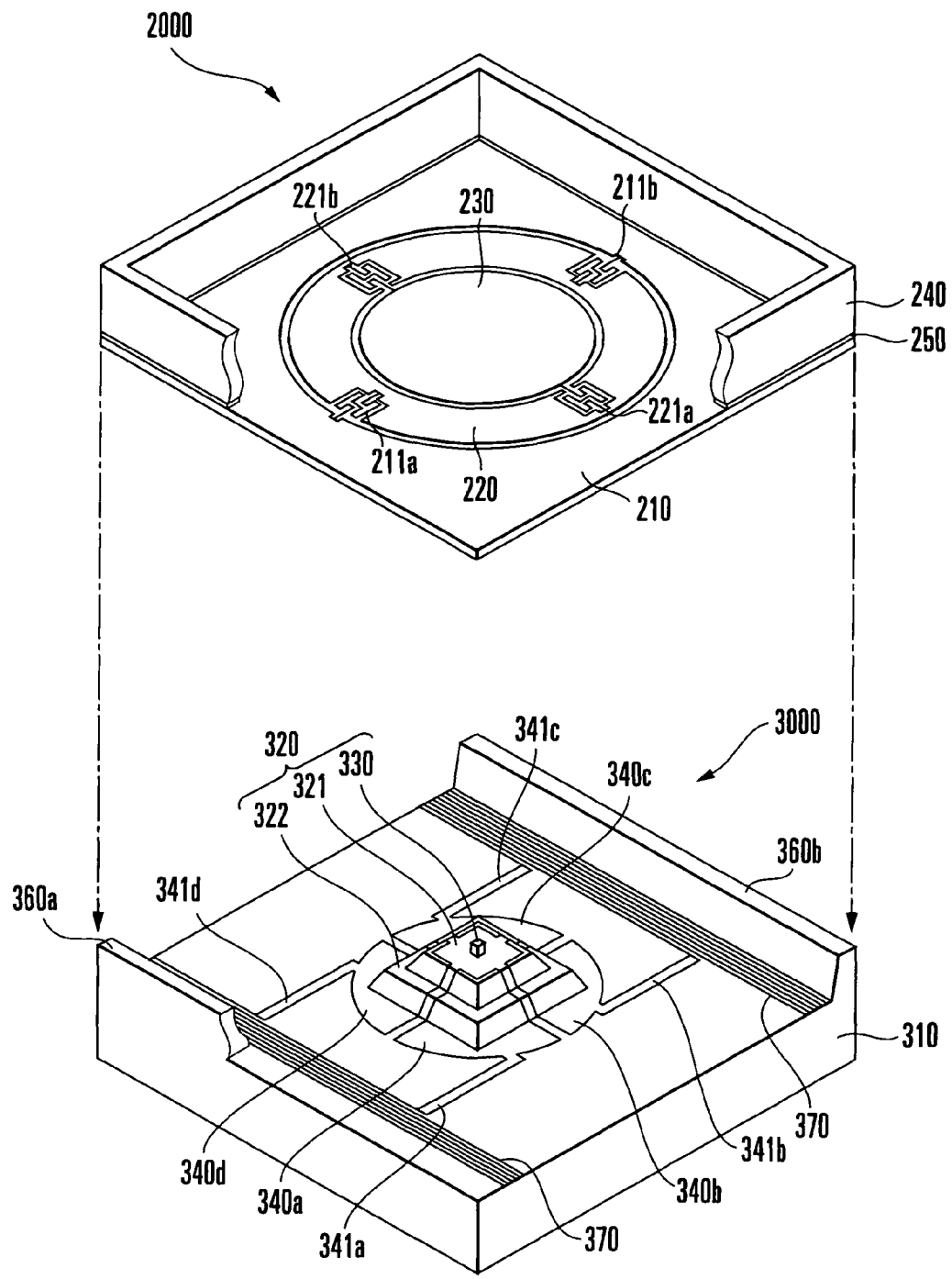
FIG. 11 is an exploded perspective view of a mirror device which constitutes a mirror array.
Figure 12:
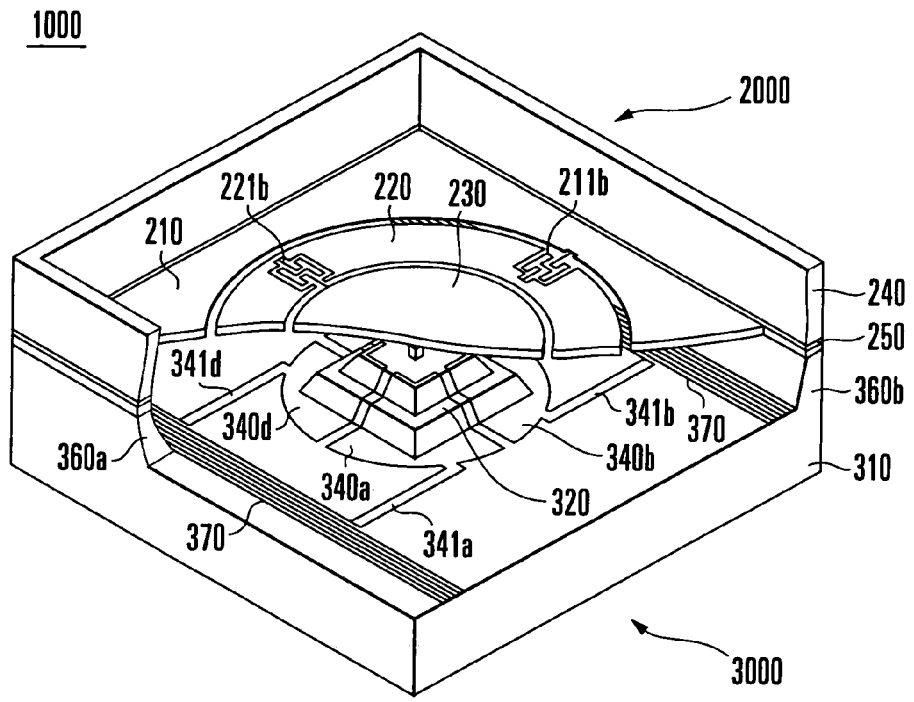
FIG. 12 is a partially exploded view of the mirror device.
Figure 13:
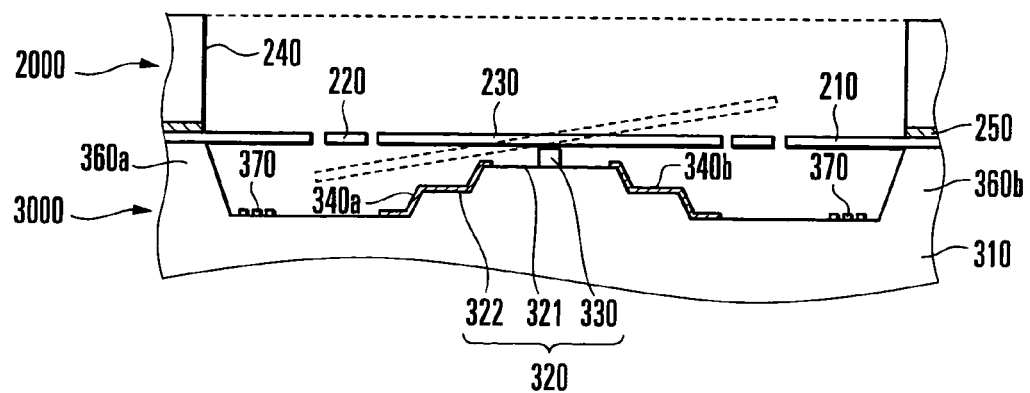
FIG. 13 is a sectional view of the mirror device.

A mirror array will be described as an example of a device to which the spring 1 of the embodiment described above is applied. The mirror array is obtained by disposing a plurality of mirror arrays one-dimensionally to form a straight line, or two-dimensionally to form a matrix. FIGS. 11 to 13 show an example of a mirror device comprising one mirror to serve as one constituent unit of a mirror array.

A mirror device 1000 has a structure in which a mirror substrate 2000 having a mirror and an electrode substrate 3000 having electrodes are arranged parallel to each other to oppose each other.

The mirror substrate 2000 comprises a plate-like frame portion 210 having an opening which is almost circular when seen from the top, a gimbal (movable frame) 220 disposed in the opening of the frame portion 210 by a pair of gimbal connectors 211a and 211b and having an opening which is almost circular when seen from the top, and the mirror 230 which is disposed in the opening of the gimbal 220 by a pair of mirror connectors 221a and 221b and almost circular when seen from the top. A frame-like member 240 surrounding the gimbal 220 and a mirror 230 is arranged on the upper surface of the frame portion 210.

Each of the pair of gimbal connectors 211a and 211b formed in the notches of the gimbal 220 has the same structure as that of the spring 1 described above, and connects the frame portion 210 to the gimbal 220. This supports the gimbal 220 to be pivotal about a pivot axis (gimbal pivot axis) extending through the pair of gimbal connectors 211a and 211b.

Each of the pair of mirror connectors 221a and 221b formed in the notches of the gimbal 220 has the same structure as that of the spring 1 described above, and connects the gimbal 220 to the mirror 230. This supports the mirror 230 to be pivotal about a pivot axis (mirror pivot axis) extending through the pair of mirror connectors 221a and 221b. The gimbal pivot axis and mirror pivot axis are perpendicular to each other.

The electrode substrate 3000 has a plate-like base 310 and a conical projection 320 which projects from the surface (upper surface) of the base 310 and is formed at a position opposing the mirror 230 of the mirror substrate 2000. The projection 320 comprises a second terrace 322 of a prismoid formed on the upper surface of the base 310, a first terrace 321 of a prismoid formed on the upper surface of the second terrace 322, and a columnar pivot 330 formed on the upper surface of the first terrace 321. The pivot 330 is formed to locate at almost the center of the first terrace 321. Thus, the pivot 330 is disposed at a position opposing the center of the mirror 230.

Four fan-shaped electrodes 340a to 340d are formed on the outer surface of the projection 320 and the upper surface of the base 310 to fall within a circle concentric with the mirror 230 of the opposing mirror substrate 2000. A pair of protrusions 360a and 360b which line up to sandwich the projection 320 are formed on the upper surface of the base 310. Furthermore, interconnections 370 are formed between the projection 320 and protrusion 360a and between the projection 320 and protrusion 360b on the upper surface of the base 310. The interconnections 370 are connected to the electrodes 340a to 340d through lines 341a to 340d.

The mirror substrate 2000 and electrode substrate 3000 as described above constitute the mirror device 1000 as shown in FIG. 12 as the lower surface of the frame portion 210 is bonded to the upper surfaces of the protrusions 360a and 360b such that the mirror 230 opposes the electrodes 340a to 340d that oppose it.

In the mirror device 1000, voltages are separately applied to the electrodes 340a to 340d through the interconnections 370, so that electric fields formed by the potential differences between the mirror 230 and electrodes 340a to 340d apply electrostatic attracting forces to the mirror 230. This elastically deforms the gimbal connectors 211a and 211b and mirror connectors 221a and 221b each formed of the spring 1 to tilt the mirror 230 through an angle of several degrees. This operation can be described as follows by referring to FIG. 13. When no voltage is applied to the electrodes 340a to 340d, the mirror 230 is in a state (to be referred to as an initial position hereinafter) of almost parallel to the electrode substrate 3000, as indicated by a solid line in FIG. 13. In this state, when a voltage is applied to, e.g., the electrode 340a, the gimbal 220 and mirror 230 pivot about a pivot axis extending through the gimbal connectors 211a and 211b and a pivot axis extending through the mirror connectors 221a and 221b, respectively, to tilt as indicated by a broken line in FIG. 13.

[Optical Switch]

Figure 14:
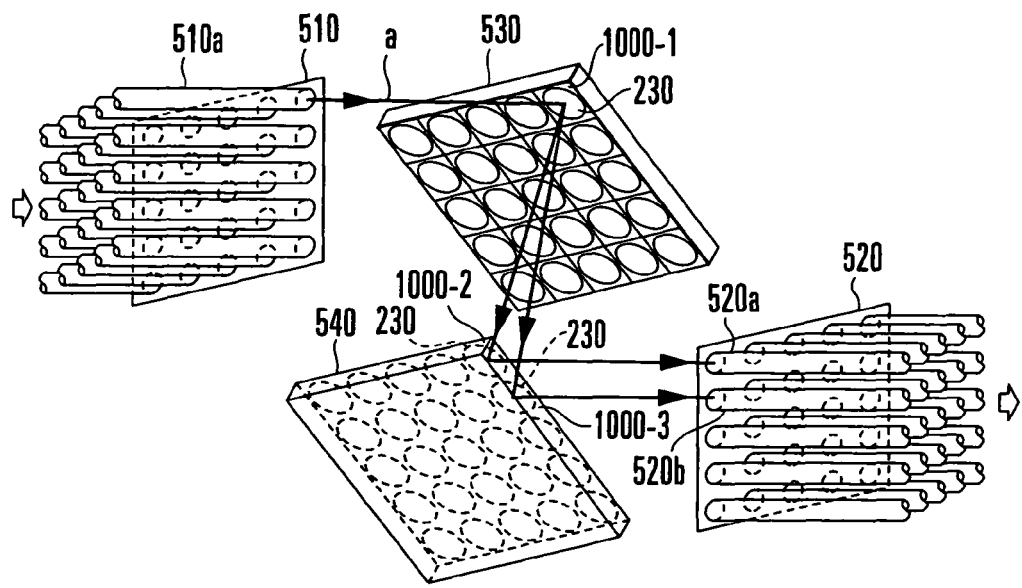
FIG. 14 is a view showing the arrangement of an optical switch.

FIG. 14 shows an optical switch comprising such a mirror device 1000. An optical switch 5000 comprises a pair of collimator arrays 510 and 520 in each obtained by arranging a plurality of optical fibers two-dimensionally, and a pair of mirror arrays 530 and 540 each obtained by arranging the mirror devices 1000 each as described two-dimensionally. In this optical switch 5000, an optical beam input from the collimator array 510 serving as an input port is reflected by the mirror arrays 530 and 540 to reach the collimator array 520 serving as an output port, and is output from the collimator array 520.

For example, an optical beam a introduced from an optical fiber 510a of the collimator array 510 into the optical switch 5000 irradiates a mirror device 1000-1 of the mirror array 530. Then, the optical beam a is reflected by a mirror 230 of the mirror device 1000-1 to reach a mirror device 1000-2 of the mirror array 540. In the mirror array 540, in the same manner as in the mirror array 530, the optical beam is reflected by a mirror 230 of the mirror device 1000-2 to reach an optical fiber 520a of the collimator array 520.

Assume that the tilt angle of the mirror 230 of the mirror device 1000-1 is changed to reflect the optical beam a toward a mirror 230 of a mirror device 1000-3. At this time, if the mirror 230 of the mirror device 1000-3 is set at an appropriate angle in advance, the optical beam a is reflected by the mirror device 1000-3 to finally reach an optical fiber 520b of the collimator array 520. In this manner, in the optical switch 5000 of this embodiment, the tilt angle of the mirror 230 of the mirror device 1000 included in the mirror array is appropriately changed to change the reflecting direction of the input optical beam, so that the optical beam is output to an arbitrary output port, thus performing switching operation. Thus, the collimate beam input from the collimator array 20 need not be converted into an electrical signal but can be directly, spatially cross-connected in the form of the optical beam to the collimator array 20.

When the mirror device, mirror array, or optical switch as described above employs the spring 1, since the spring can be set to have desired characteristics, the spring may not be broken or stick to another member during the manufacturing process or the use of the mirror device. As a result, the yield is improved, thus realizing an improvement in productivity and a reduction in cost.

For example, the spring can have a lower spring constant in the direction R, that is, can be formed to be elastic against pivot motion, and a larger spring constant in the X direction than those of the conventional serpentine-shaped spring. This can prevent major problems in the MEMS, e.g., a sticking phenomenon in which a plurality of structures undesirably come into contact with each other to stick to each other, in the manufacturing stage of various types of devices such as a mirror device, mirror array, optical switch, or the like comprising the spring of this embodiment. In a device that comprises the spring of this embodiment or a system that uses this device, the durability against vibration or impact generated during conveyance or use increases, thus decreasing the susceptibility to a failure.

[Method of Manufacturing Mirror Array]

A method of manufacturing the mirror array described above will be described. The mirror substrate 2000 is formed of a SOI (Silicon On Insulator) substrate.

First, using a known photolithography technique and an etching technique such as DEEP RIE, a single-crystal silicon layer is selectively etched from that side (major upper surface: SOI layer) of the SOI substrate where a buried insulating layer 250 is formed to form trenches corresponding to the shapes of the frame portion 210, gimbal connectors 211a and 211b, gimbal 220, mirror connectors 221a and 221b, and mirror 230. At this time, the trenches are formed such that each of the gimbal connectors 211a and 211b and the mirror connectors 221a and 221b has a shape corresponding to the spring 1 described above.

Subsequently, a resist pattern having openings at predetermined regions corresponding to the trenches is formed on the lower surface of the SOI substrate, and silicon is selectively etched from the lower surface of the SOI substrate by dry etching using $SF_6$ or the like. In this etching, the openings and the frame-like member 240 are formed on the lower surface of the SOI substrate by using the buried insulating layer 250 as an etching stopper layer. Silicon may be etched by wet etching using potassium hydroxide or the like.

Subsequently, those regions of the buried insulating layer 250 which are exposed in the openings are removed by dry etching using $CF_4$ or the like. Thus, the mirror substrate 2000 is formed. The buried insulating layer 250 may be removed by using hydrofluoric acid.

The electrode substrate 3000 is formed of, e.g., a silicon substrate. First, using a predetermined mask pattern formed of a silicon nitride film or silicon oxide film as a mask, the silicon substrate is selectively etched with a solution of potassium hydroxide. This etching is repeated to form the base 310, first and second terraces 321 and 322, pivot 330, and protrusions 360a and 360b.

Subsequently, the etched surface of the silicon substrate is oxidized to form a silicon oxide film. A metal film is formed on the silicon oxide film by vapor deposition or the like. The metal film is patterned by the known photolithography technique and etching technique to form the electrodes 340a to 340d, lines 341a to 341d, and interconnections 370. Thus, the electrode substrate 3000 having the shape described above is formed. The shape of the electrode substrate 3000 may be formed not only by partially removing a flat substrate by etching as described above, but also on the flat substrate using the known lithography or plating technique.

After that, the mirror substrate 2000 and electrode substrate 3000 are adhered to each other, thus manufacturing a mirror array having the mirror device 1000 which can move the mirror 230 by application of an electric field to the electrodes 340a to 340d.

According to this embodiment, as described above with reference to FIGS. 10A and 10B, by employing the spring 1, the mirror device 1000 and the mirror array can be designed and arranged in a compact manner. For example, in a mirror array obtained by arranging the plurality of mirror devices 1000 each shown in FIG. 11, the width of the frame-like member 240 and the pitch (center-to-center distance of the mirrors 230) among the plurality of mirror devices 1000 depend on the design of an optical system which is to be formed using the MEMS mirror, particularly, the shape of the spring 1 that constitutes each of the gimbal connectors 211a and 211b and mirror connectors 221a and 221b arranged in the vicinity of the frame-like member 240. The smaller the structure of the spring 1, the smaller the mirror array, and the smaller the pivot angle of the mirror 230. When the length of the spring 1 in the direction of the pivot axis is decreased, the width of the frame-like member 240 can be increased. Thus, the mechanical strength can be ensured. Hence, by employing the spring 1 of this embodiment, the mirror pitch of the mirror devices or mirror arrays can be decreased, and the width of the frame-like member 240 can be increased. As a result, the degree of freedom in design can be increased.

The spring of this embodiment can be applied not only to the mirror device, mirror array, and optical switch described above, but also to various types of devices such as a micromachine or semiconductor device as far as it serves to connect two members.

In the spring of this embodiment, the degree of freedom in characteristics design can be increased more than in a conventional serpentine spring or a spring having a simple beam structure. Therefore, the spring of this embodiment can be utilized as a spring which is arranged at a location with a small area or volume and is pivoted. In particular, the MEMS device which has been researched, developed, and manufactured widely in recent years must satisfy not only restrictions on its outer shape such as the size or thickness but also strict conditions in its characteristics. If the spring of this embodiment is applied, such conditions can be satisfied.

[Other Springs]

FIGS. 15 to 20 show other arrangements of the spring of this embodiment. The spring of this embodiment can be set appropriately and freely as far as the total length of the members formed in the direction of the pivot axis, that is, in the direction of the X-axis is larger than the spring length, or desirably larger than the total length of the members formed in the direction of the Y-axis.

Figure 15:
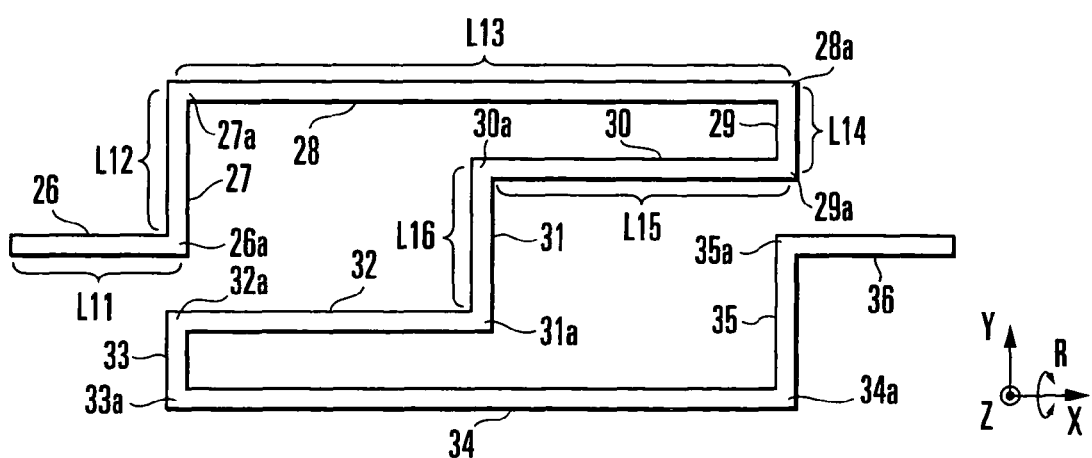
FIG. 15 is a view showing another arrangement of the spring of the present invention.

For example, as in a spring 2 shown in FIG. 15, a spring may have an almost rectangular section in a direction perpendicular to the X-axis or Y-axis direction, and members 26 to 36 may be continuously connected through bending portions 26a to 35a, so that the spring has a planar shape which is obtained by forming two, one large and one small almost L shapes to be point-symmetric about almost the center of the pivot axis. In the spring 2, the member 26 is connected to one member and the member 36 is connected to another member, thus connecting one member to another member. The planar shape of the spring 2 will now be described hereinafter in more detail.

The member 26 is formed to extend from one end where it is connected to one member for a distance L11 in the positive direction along the X-axis. The member 27 is formed to extend from one end where it is connected to the bending portion 26a at the other end of the member 26 for a distance L12 in the positive direction along the Y-axis. The member 28 is formed to extend from one end where it is connected to the bending portion 27a at the other end of the member 27 for a distance L13 in the positive direction along the X-axis. The member 29 is formed to extend from one end where it is connected to the bending portion 28a at the other end of the member 28 for a distance L14 (L14<L12) in the negative direction along the Y-axis. The member 30 is formed to extend from one end where it is connected to the bending portion 29a at the other end of the member 29 for a distance L15 (2L15=L13) in the negative direction along the X-axis. The member 31 is formed to extend from one end where it is connected to the bending portion 30a at the other end of the member 30 for a distance L16 (L16+2L14=2L12) in the negative direction along the Y-axis.

The member 32 is formed to extend from one end where it is connected to the bending portion 31a at the other end of the member 31 for the distance L15 in the negative direction along the X-axis. The member 33 is formed to extend from one end where it is connected to the bending portion 32a at the other end of the member 32 for the distance L14 in the negative direction along the Y-axis. The member 34 is formed to extend from one end where it is connected to the bending portion 33a at the other end of the member 33 for the distance L13 in the positive direction along the X-axis. The member 35 is formed to extend from one end where it is connected to the bending portion 34a at the other end of the member 34 for the distance L12 in the positive direction along the Y-axis. The member 36 is formed to extend from one end where it is connected to the bending portion 35a at the other end of the member 35 for the distance L11 in the positive direction along the X-axis.

The total length of the members 26, 28, 30, 32, 34, and 36 formed in the X-axis direction of the spring 2 is larger than the spring length of the whole spring 2, and larger than the total length of the members 27, 29, 31, 33, and 35 formed in the Y-axis direction of the spring 2. Thus, the spring constant in the direction R can be set appropriately and freely within a wide range without decreasing the spring constants in the X-axis, Y-axis, and Z-axis directions to be lower than those of the conventional spring. As a result, this can prevent the spring 2 from being broken or sticking to another member.

The lengths of the members 26 to 36 can be set appropriately and freely such that, for example, the lengths of all the members differ or the axis of the member 26 does not coincide with that of the member 36, as far as each of the members 26 to 36 is spaced apart from any member parallel to it. Hence, the sum distance of the members 27 and 35 need not be equal to the sum distance of the members 29, 31, and 33.

Figure 16:
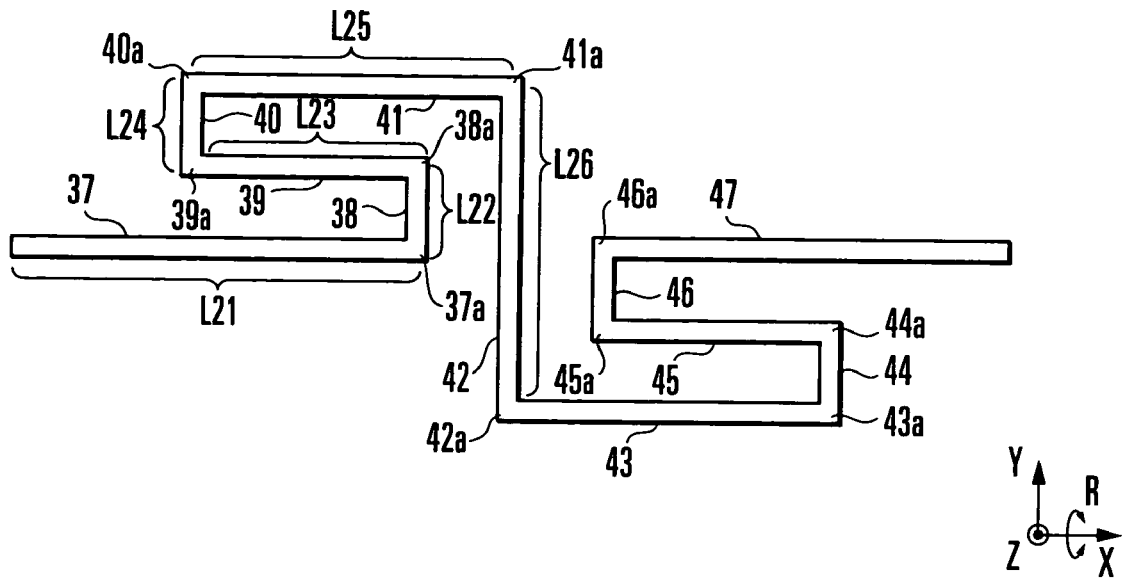
FIG. 16 is a view showing still another arrangement of the spring of the present invention.

Also, as in a spring 3 shown in FIG. 16, a spring may have an almost rectangular section in a direction perpendicular to the X-axis or Y-axis direction, and members 37 to 47 may be continuously connected through bending portions 37a to 46a, so that the spring has a planar shape which is obtained by forming an almost S shape to be point-symmetric about almost the center of the pivot axis. In such a spring 3, the member 37 is connected to one member and the member 47 is connected to another member, thus connecting one member to another member. The planar shape of the spring 3 will now be described hereinafter in more detail.

The member 37 is formed to extend from one end where it is connected to one member for a distance L21 in the positive direction along the X-axis. The member 38 is formed to extend from one end where it is connected to the bending portion 37a at the other end of the member 37 for a distance L22 in the positive direction along the Y-axis. The member 39 is formed to extend from one end where it is connected to the bending portion 38a at the other end of the member 38 for a distance L23 (L23<L21) in the negative direction along the X-axis. The member 40 is formed to extend from one end where it is connected to the bending portion 39a at the other end of the member 39 for a distance L24 in the positive direction along the Y-axis. The member 41 is formed to extend from one end where it is connected to the bending portion 40a at the other end of the member 40 for a distance L25 (L25>L23) in the positive direction along the X-axis. The member 42 is formed to extend from one end where it is connected to the bending portion 41a at the other end of the member 41 for a distance L26 (L2=2L22+2L24) in the negative direction along the Y-axis.

The member 43 is formed to extend from one end where it is connected to the bending portion 42a at the other end of the member 42 for the distance L25 in the positive direction along the X-axis. The member 44 is formed to extend from one end where it is connected to the bending portion 43a at the other end of the member 43 for the distance L24 in the positive direction along the Y-axis. The member 45 is formed to extend from one end where it is connected to the bending portion 44a at the other end of the member 44 for the distance L23 in the negative direction along the X-axis. The member 46 is formed to extend from one end where it is connected to the bending portion 45a at the other end of the member 45 for the distance L22 in the positive direction along the Y-axis. The member 47 is formed to extend from one end where it is connected to the bending portion 46a at the other end of the member 46 for the distance L21 in the positive direction along the X-axis.

The total length of the members 37, 39, 41, 43, 45, and 47 formed in the X-axis direction of the spring 3 is larger than the spring length of the whole spring 3, and larger than the total length of the members 38, 40, 42, 44, and 46 formed in the Y-axis direction of the spring 3. Thus, the spring constant in the direction R can be set appropriately and freely within a wide range without decreasing the spring constants in the X-axis, Y-axis, and Z-axis directions to be lower than those of the conventional spring. As a result, this can prevent the spring 3 from being broken or sticking to another member.

Although the members 38 and 40, and the members 44 and 46 respectively have the same lengths in the spring 3, they may have different lengths. Thus, the shape of the spring 3 can be set appropriately and freely to match the shape of the device.

The lengths of the members 37 to 47 can be set appropriately and freely such that, for example, the lengths of all the members differ or the axis of the member 37 does not coincide with that of the member 47, as far as each of the members 37 to 47 is spaced apart from any member parallel to it. Hence, the sum distance of the members 38, 40, 44, and 46 need not be equal to the distance the member 42.

Figure 17:
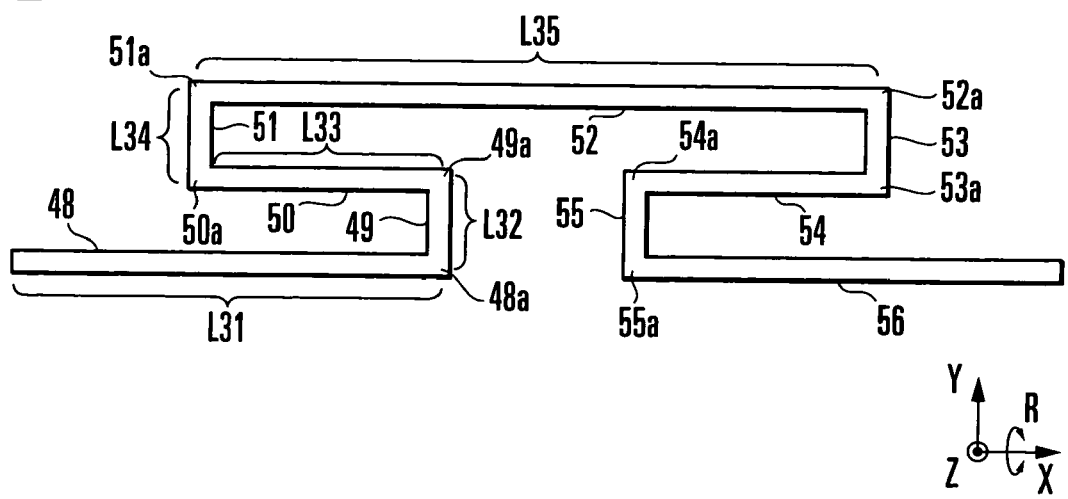
FIG. 17 is a view showing still another arrangement of the spring of the present invention.

Also, as in a spring 4 shown in FIG. 17, a spring may have an almost rectangular section in a direction perpendicular to the X-axis or Y-axis direction, and members 48 to 56 may be continuously connected through bending portions 48a to 55a, so that the spring has a planar shape which is obtained by forming an almost square shape on one side of the pivot axis. In such a spring 4, the member 48 is connected to one member and the member 56 is connected to another member, thus connecting one member to another member. The planar shape of the spring 4 will now be described hereinafter in more detail.

The member 48 is formed to extend from one end where it is connected to one member for a distance L31 in the positive direction along the X-axis. The member 49 is formed to extend from one end where it is connected to the bending portion 48a at the other end of the member 48 for a distance L32 in the positive direction along the Y-axis. The member 50 is formed to extend from one end where it is connected to the bending portion 49a at the other end of the member 49 for a distance L33 (L33<L31) in the negative direction along the X-axis. The member 51 is formed to extend from one end where it is connected to the bending portion 50a at the other end of the member 50 for a distance L34 in the positive direction along the Y-axis. The member 52 is formed to extend from one end where it is connected to the bending portion 51a at the other end of the member 51 for a distance L35 (L35>2L33) in the positive direction along the X-axis.

The member 53 is formed to extend from one end where it is connected to the bending portion 52a at the other end of the member 52 for the distance L34 in the negative direction along the Y-axis. The member 54 is formed to extend from one end where it is connected to the bending portion 53a at the other end of the member 53 for the distance L33 in the negative direction along the X-axis. The member 55 is formed to extend from one end where it is connected to the bending portion 54a at the other end of the member 54 for the distance L32 in the negative direction along the Y-axis. The member 56 is formed to extend from one end where it is connected to the bending portion 55a at the other end of the member 55 for the distance L31 in the positive direction along the X-axis.

The total length of the members 48, 50, 52, 54, and 56 formed in the X-axis direction of the spring 4 is larger than the spring length of the whole spring 4, and larger than the total length of the members 49, 51, 53, and 55 formed in the Y-axis direction of the spring 4. Thus, the spring constant in the direction R can be set appropriately and freely within a wide range without decreasing the spring constants in the X-axis, Y-axis, and Z-axis directions to be lower than those of the conventional spring. As a result, this can prevent the spring 4 from being broken or sticking to another member.

Although the members 49 and 55, the members 50 and 54, and the members 51 and 53 respectively have the same lengths in the spring 4, they may have different lengths. In the spring 4, one member having an almost square shape when seen from the top is formed. However, the number of such members is not limited to one, but can be set appropriately and freely. Thus, the shape of the spring 4 can be set appropriately and freely to match the shape of the device.

The lengths of the members 48 to 56 can be set appropriately and freely such that, for example, the lengths of all the members differ or the axis of the member 48 does not coincide with that of the member 56, as far as each of the members 48 to 56 is spaced apart from any member parallel to it. Hence, the sum distance of the members 49 and 51 need not be equal to the sum of the distances of the members 53 and 55.

Figure 18:
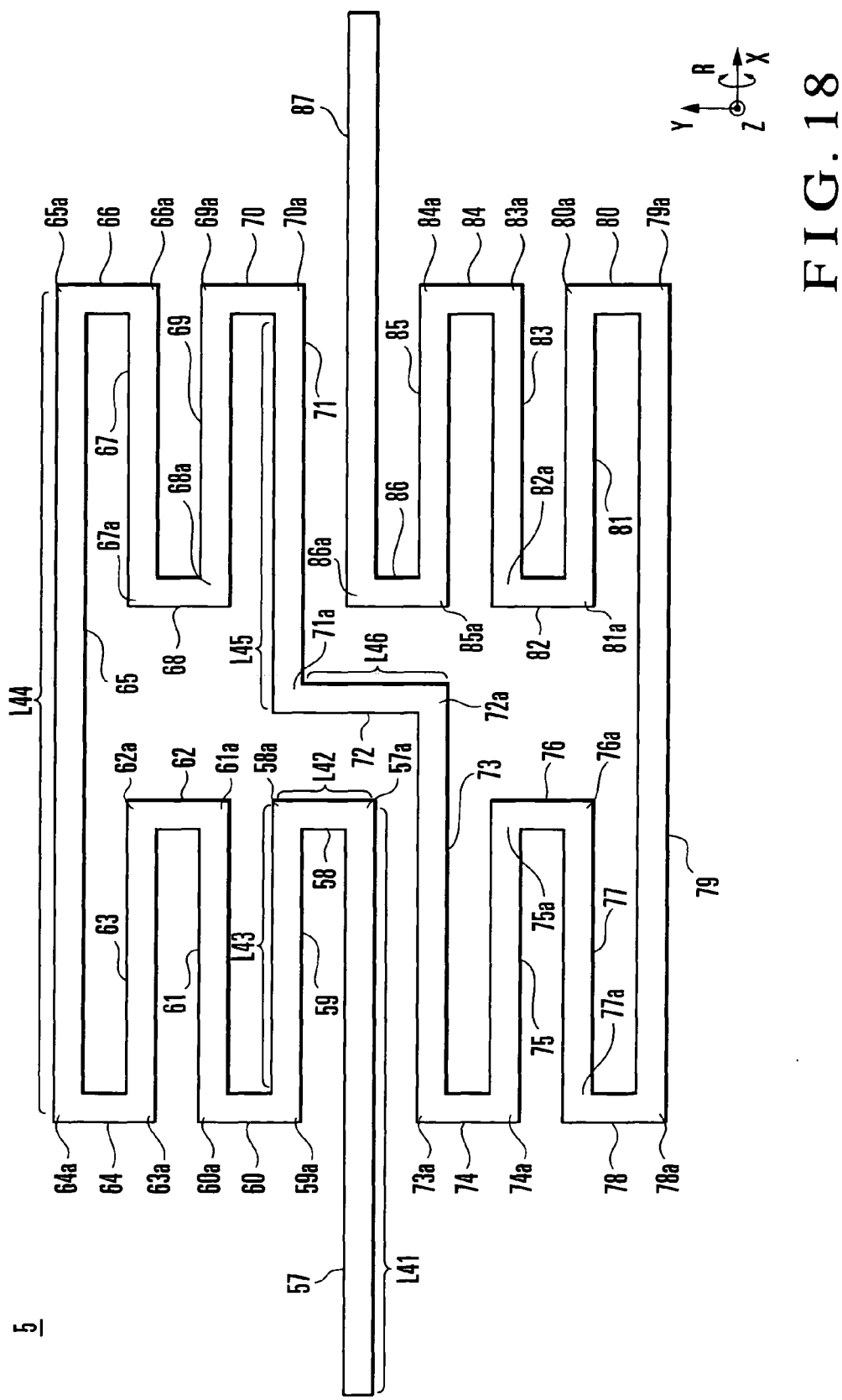
FIG. 18 is a view showing still another arrangement of the spring of the present invention.

Also, as in a spring 5 shown in FIG. 18, a spring may have an almost rectangular section in a direction perpendicular to the X-axis or Y-axis direction, and members 57 to 87 may be continuously connected through bending portions 57a to 86a, so that the spring has a planar shape which is obtained by forming two almost square shapes arranged to line up in the Y-axis direction to be symmetric about the pivot axis. In such a spring 5, the member 57 is connected to one member and the member 87 is connected to another member, thus connecting one member to another member. The planar shape of the spring 5 will now be described hereinafter in more detail.

The member 57 is formed to extend from one end where it is connected to one member for a distance L41 in the positive direction along the X-axis. The member 58 is formed to extend from one end where it is connected to the bending portion 57a at the other end of the member 57 for a distance L42 in the positive direction along the Y-axis. The member 59 is formed to extend from one end where it is connected to the bending portion 58a at the other end of the member 58 for a distance L43 (L43<L41) in the negative direction along the X-axis. The member 60 is formed to extend from one end where it is connected to the bending portion 59a at the other end of the member 59 for the distance L42 in the positive direction along the Y-axis. The member 61 is formed to extend from one end where it is connected to the bending portion 60a at the other end of the member 60 for the distance L43 in the positive direction along the X-axis. The member 62 is formed to extend from one end where it is connected to the bending portion 61a at the other end of the member 61 for the distance L42 in the positive direction along the Y-axis.

The member 63 is formed to extend from one end where it is connected to the bending portion 62a at the other end of the member 62 for the distance L43 in the negative direction along the X-axis. The member 64 is formed to extend from one end where it is connected to the bending portion 63a at the other end of the member 63 for the distance L42 in the positive direction along the Y-axis. The member 65 is formed to extend from one end where it is connected to the bending portion 64a at the other end of the member 64 for a distance L44 (L44>2L43) in the positive direction along the X-axis. The member 66 is formed to extend from one end where it is connected to the bending portion 65a at the other end of the member 65 for the distance L42 in the negative direction along the Y-axis. The member 67 is formed to extend from one end where it is connected to the bending portion 66a at the other end of the member 66 for the distance L43 in the negative direction along the X-axis. The member 68 is formed to extend from one end where it is connected to the bending portion 67a at the other end of the member 67 for the distance L42 in the negative direction along the Y-axis.

The member 69 is formed to extend from one end where it is connected to the bending portion 68a at the other end of the member 68 for the distance L43 in the positive direction along the X-axis. The member 70 is formed to extend from one end where it is connected to the bending portion 69a at the other end of the member 69 for the distance L42 in the negative direction along the Y-axis. The member 71 is formed to extend from one end where it is connected to the bending portion 70a at the other end of the member 70 for a distance L45 (2L45=L44) in the negative direction along the X-axis. The member 72 is formed to extend from one end where it is connected to the bending portion 71a at the other end of the member 71 for the distance L46 (L46=2L42) in the negative direction along the Y-axis. The member 73 is formed to extend from one end where it is connected to the bending portion 72a at the other end of the member 72 for the distance L45 in the negative direction along the X-axis. The member 74 is formed to extend from one end where it is connected to the bending portion 73a at the other end of the member 73 for the distance L42 in the negative direction along the Y-axis.

The member 75 is formed to extend from one end where it is connected to the bending portion 74a at the other end of the member 74 for the distance L43 in the positive direction along the X-axis. The member 76 is formed to extend from one end where it is connected to the bending portion 75a at the other end of the member 75 for the distance L42 in the negative direction along the Y-axis. The member 77 is formed to extend from one end where it is connected to the bending portion 76a at the other end of the member 76 for the distance L43 in the negative direction along the X-axis. The member 78 is formed to extend from one end where it is connected to the bending portion 77a at the other end of the member 77 for the distance L42 in the negative direction along the Y-axis. The member 79 is formed to extend from one end where it is connected to the bending portion 78a at the other end of the member 78 for the distance L44 in the positive direction along the X-axis. The member 80 is formed to extend from one end where it is connected to the bending portion 79a at the other end of the member 79 for the distance L42 in the positive direction along the Y-axis.

The member 81 is formed to extend from one end where it is connected to the bending portion 80a at the other end of the member 80 for the distance L43 in the negative direction along the X-axis. The member 82 is formed to extend from one end where it is connected to the bending portion 81a at the other end of the member 81 for the distance L42 in the positive direction along the Y-axis. The member 83 is formed to extend from one end where it is connected to the bending portion 82a at the other end of the member 82 for the distance L43 in the positive direction along the X-axis. The member 84 is formed to extend from one end where it is connected to the bending portion 83a at the other end of the member 83 for the distance L42 in the positive direction along the Y-axis. The member 85 is formed to extend from one end where it is connected to the bending portion 84a at the other end of the member 84 for the distance L43 in the negative direction along the X-axis. The member 86 is formed to extend from one end where it is connected to the bending portion 85a at the other end of the member 85 for the distance L42 in the positive direction along the Y-axis. The member 87 is formed to extend from one end where it is connected to the bending portion 86a at the other end of the member 86 for the distance L41 in the positive direction along the X-axis.

The total length of the members 57, 59, 61, 63, 65, 67, 69, 71, 73, 75, 77, 79, 81, 83, 85, and 87 formed in the X-axis direction of the spring 5 is larger than the spring length of the whole spring 5, and larger than the total length of the members 58, 60, 62, 64, 66, 68, 70, 72, 74, 76, 78, 80, 82, 84, and 86 formed in the Y-axis direction of the spring 5. Thus, the spring constant in the direction R can be set appropriately and freely within a wide range without decreasing the spring constants in the X-axis, Y-axis, and Z-axis directions to be lower than those of the conventional spring. As a result, this can prevent the spring 5 from being broken or sticking to another member. In particular, as the spring 5 has a large number of folds, the total length of the members formed parallel to the X-axis direction can be increased to be larger than in any of the springs 1 to 4 described above. This can decrease the spring constant in the direction R.

In the spring 5, two members each having an almost square shape when seen from the top are formed at each of one side and the other side of the widthwise direction. However, the number of members each having an almost square shape when seen from the top is not limited to two, but can be set appropriately and freely. At this time, the number of such members may differ between one side and the other side of the widthwise direction. Although the almost square shapes when seen from the top line up in the widthwise direction, they may line up in the longitudinal direction or be arranged to be point-symmetric. Thus, the shape of the spring 5 can be set appropriately and freely to match the shape of the device.

The lengths of the members 57 to 87 can be set appropriately and freely such that, for example, the lengths of all the members differ or the axis of the member 57 does not coincide with that of the member 87, as far as each of the members 57 to 87 is spaced apart from any member parallel to it. Hence, the sum distance of the members 58, 60, 62, 64, 80, 82, 84, and 86 need not be equal to the sum distance of the members 66, 68, 70, 72, 74, 76, and 78.

Figure 19:
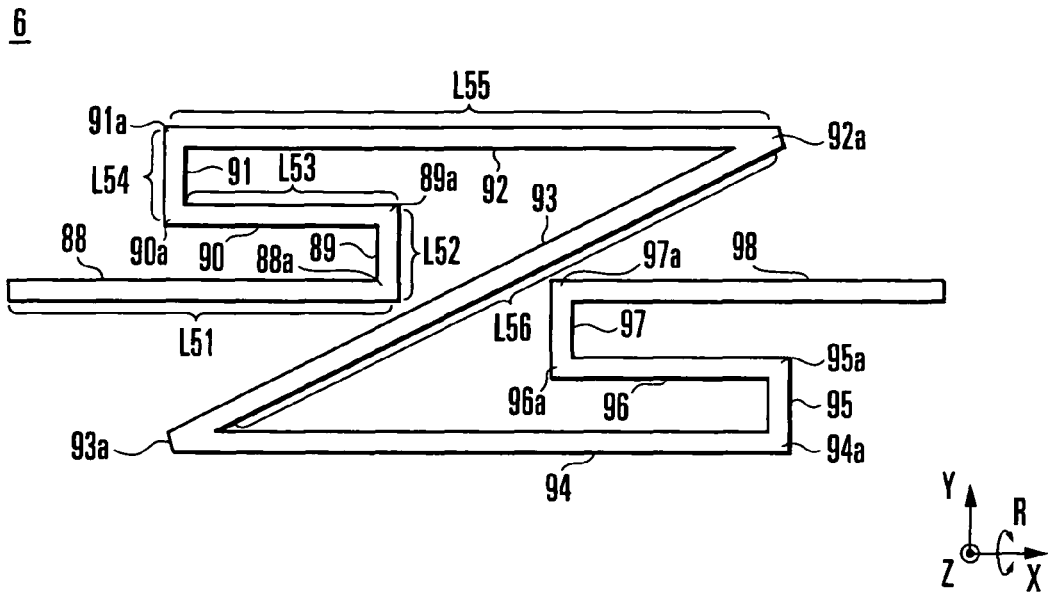
FIG. 19 is a view showing still another arrangement of the spring of the present invention.

Also, as in a spring 6 shown in FIG. 19, a spring may have an almost rectangular section in a direction perpendicular to the X-axis or Y-axis direction, and members 88 to 98 may be continuously connected through bending portions 88a to 97a, so that the spring has a planar shape which is obtained by connecting almost S shapes to be point-symmetric about almost the center of the pivot axis by a member disposed obliquely to the pivot axis. In such a spring 6; the member 88 is connected to one member and the member 97 is connected to another member, thus connecting one member to another member. The planar shape of the spring 6 will now be described hereinafter in more detail.

The member 88 is formed to extend from one end where it is connected to one member for a distance L51 in the positive direction along the X-axis. The member 89 is formed to extend from one end where it is connected to the bending portion 88a at the other end of the member 88 for a distance L52 in the positive direction along the Y-axis. The member 90 is formed to extend from one end where it is connected to the bending portion 89a at the other end of the member 89 for a distance L53 (L53<L51) in the negative direction along the X-axis. The member 91 is formed to extend from one end where it is connected to the bending portion 90a at the other end of the member 90 for a distance L54 in the positive direction along the Y-axis. The member 92 is formed to extend from one end where it is connected to the bending portion 91a at the other end of the member 91 for a distance L55 (L55>2L53) in the positive direction along the X-axis.

The member 93 is formed to extend from one end where it is connected to the bending portion 92a at the other end of the member 92 to a position axi-symmetric to one end of the member 92 about the longitudinal direction of the member 88. The spring 6 of this embodiment is formed to satisfy the following equation (1):

$$(2L52+2L54)^2+(L55)^2=(L56)^2 \qquad (1)$$

where L56 is the length of the member 93.

The member 94 is formed to extend from one end where it is connected to the bending portion 93a at the other end of the member 93 for the distance L55 in the positive direction along the X-axis. The member 95 is formed to extend from one end where it is connected to the bending portion 94a at the other end of the member 94 for the distance L54 in the positive direction along the Y-axis. The member 96 is formed to extend from one end where it is connected to the bending portion 95a at the other end of the member 95 for the distance L53 in the negative direction along the X-axis. The member 97 is formed to extend from one end where it is connected to the bending portion 96a at the other end of the member 96 for the distance L52 in the positive direction along the Y-axis. The member 98 is formed to extend from one end where it is connected to the bending portion 97a at the other end of the member 97 for the distance L51 in the positive direction along the X-axis.

The total length of the components of the spring 6 formed along the X-axis direction is larger than the length of the whole spring 6. Assuming that the angle of the bending portion 92a is α, the total of the components of the spring 6 along the X-axis direction, that is, the total of the lengths of the members 88, 90, 92, 94, 96, and 98 and L65 cos α is larger than the length of the whole spring 6. Note that in the spring 6 shown in FIG. 19, the total length of the members 88, 90, 92, 94, 96, and 98 is larger than the length of the whole spring 6, and larger than the total length of the members 89, 91, 95, and 97 formed along the Y-axis direction. Thus, even when the member 93 is formed obliquely with respect to the X-axis and Y-axis, the spring constant in the direction R can be set appropriately and freely within a wide range without decreasing the spring constants in the X-axis, Y-axis, and Z-axis directions to be lower than those of the conventional spring. As a result, this can prevent the spring 6 from being broken or sticking to another member.

Although the members 89 and 97 and the members 91 and 95 respectively have the same lengths in the spring 6, they may have different lengths. Thus, the shape of the spring 6 can be set appropriately and freely to match the shape of the device.

The lengths of the members 88 to 98 can be set appropriately and freely such that, for example, the lengths of all the members differ or the axis of the member 88 does not coincide with that of the member 98, as far as each of the members 88 to 98 is spaced apart from any member parallel to it or from the member 93.

Figure 20:
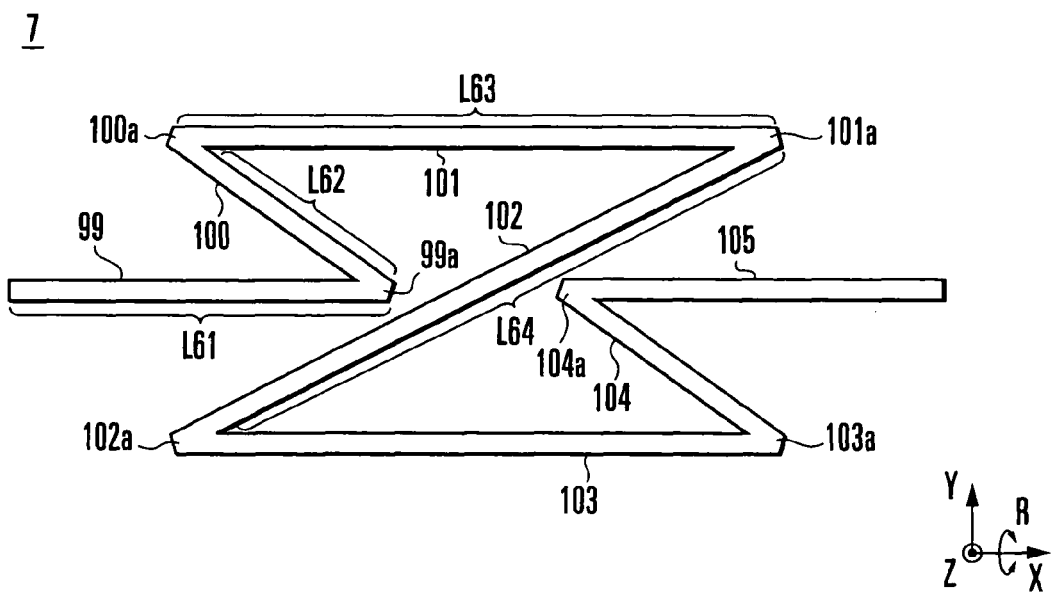
FIG. 20 is a view showing still another arrangement of the spring of the present invention.
Figure 21:
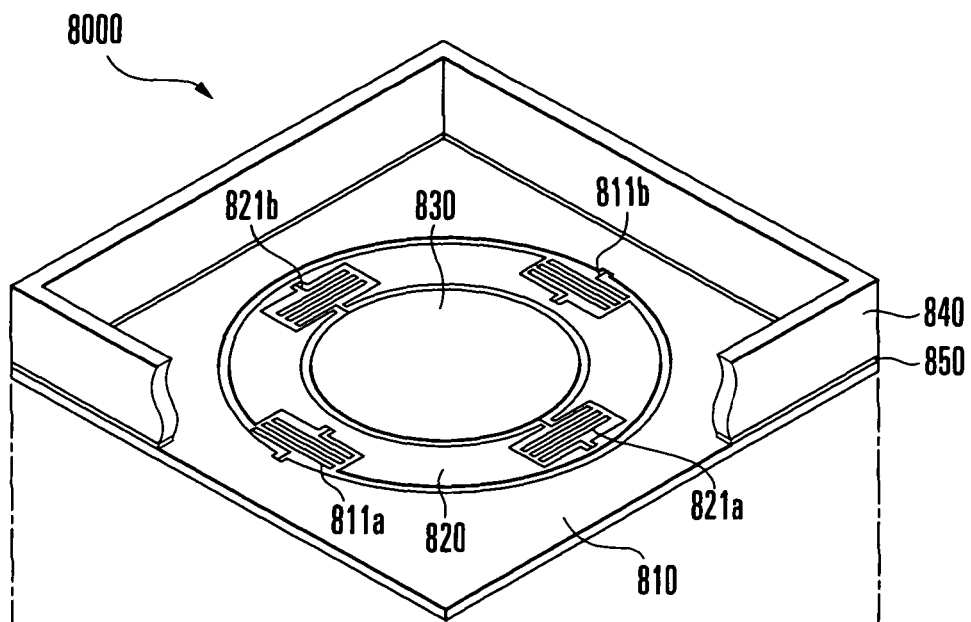
FIG. 21 is an exploded perspective view of a conventional mirror device.
Figure 21:
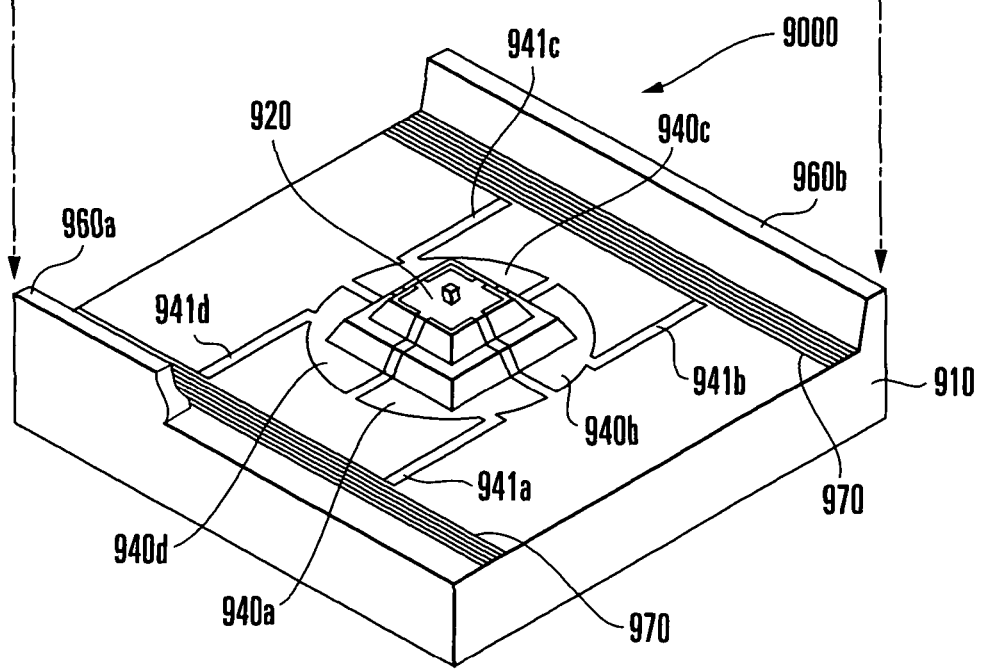
Figure 22:
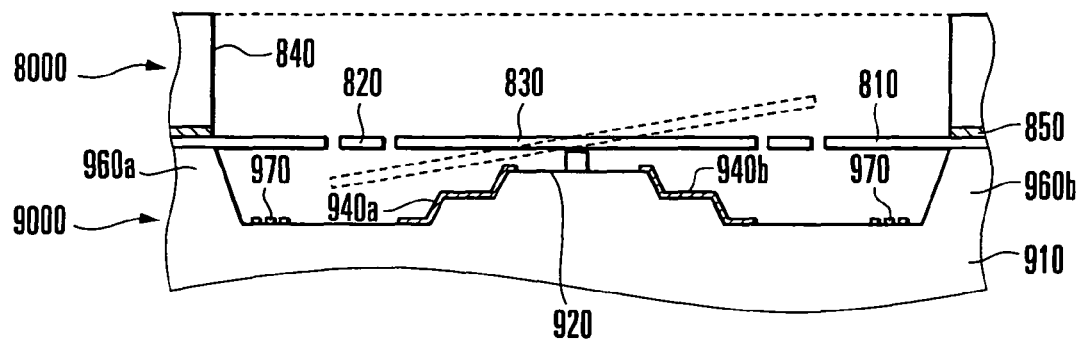
FIG. 22 is a side sectional view of the conventional mirror device.
Figure 23:
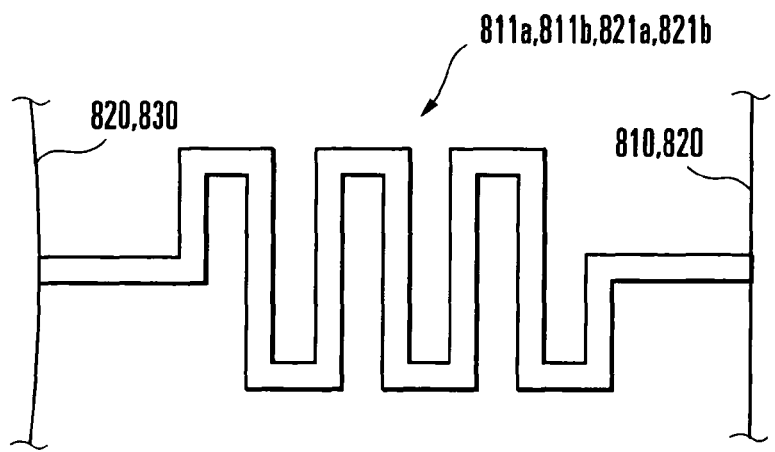
FIG. 23 is a view to explain the arrangement of the conventional spring.
Figure 23:
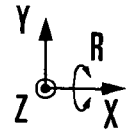

Also, as in a spring 7 shown in FIG. 20, a spring may have an almost rectangular section in a direction perpendicular to the X-axis or Y-axis direction, and members 99 to 105 may be continuously connected through bending portions 99a to 104a, so that the spring has a planar shape which is obtained by connecting almost Z shapes to be point-symmetric about almost the center of the pivot axis by a member disposed obliquely to the pivot axis. In such a spring 7, the member 99 is connected to one member and the member 105 is connected to another member, thus connecting one member to another member. The planar shape of the spring 7 will now be described hereinafter in more detail.

The member 99 is formed to extend from one end where it is connected to one member for a distance L61 in the positive direction along the X-axis. The member 100 is formed of a linear member extending for a distance L62 and disposed on the positive side of the member 99 along the Y-axis, and its one end is connected to the bending portion 99a at the other end of the member 99 at an angle $\theta_1 (0°<\theta_1<90°)$. In this embodiment, the member 100 is disposed to satisfy the following equation (2):

$$L62 \cos \theta_1 < L61 \qquad (2)$$

The member 101 is formed to extend from one end where it is connected to the bending portion 100a at the other end of the one member 100 for a distance L63 in the positive direction along the X-axis. Accordingly, the angle of the bending portion 100a is $\theta_1$. The member 102 is formed of a linear member extending for a distance L64 and disposed on the negative side along the Y-axis, and its one end is connected to the bending portion 101a at the other end of the member 101 at an angle $\theta_1 (0°<\theta_2<90°)$. In this embodiment, the member 102 is disposed to satisfy the following equation (3):

$$L64 \cos \theta_2 \approx L63 \qquad (3)$$

The member 103 is formed to extend from one end where it is connected to the bending portion 102a at the other end of the member 102 for the distance L63 in the positive direction along the X-axis. In this embodiment, the members 102 and 103 are formed to satisfy the above equation (3).

The member 104 is formed of a linear member extending for the distance L62 and disposed on the positive side of the member 103 along the Y-axis, and its one end is connected to the bending portion 103a at the other end of the member 103 at the angle $\theta_1 (0°<\theta_1<90°)$. The member 105 is formed to extend from one end where it is connected to the bending portion 104a at the other end of the member 104 for the distance L61 in the positive direction along the X-axis. In this embodiment, the members 104 and 105 are formed to satisfy the above equation (2).

In the spring 7 of this embodiment, the total length of the components of the spring 7 formed along the X-axis direction is larger than the length of the whole spring 7. The total of the components of the spring 7 along the X-axis direction, that is, the total of the lengths of the members 99, 103, and 105, the component (L62 cos $\theta_1$) of the member 100 in the X-axis direction, the component (L64 cos $\theta_2$) of the member 102 in the X-axis direction, and the component (L62 cos $\theta_1$) of the member 104 in the X-axis direction is larger than the length of the whole spring 7. Note that in the spring 7 shown in FIG. 20, the total length of the members 99, 101, 103, and 105 is larger than the length of the whole spring 7, and no member formed along the Y-axis direction is present. The total length of the components of the members 100, 102, and 104 in the Y-axis direction, which are formed obliquely with respect to the X-axis and Y-axis directions, is smaller than not only the total of the components of the spring 7 along the X-axis direction described above but also the total length of the members 99, 101, 103, and 105. Thus, even when the members 100, 102, and 104 are formed obliquely with respect to the X-axis and Y-axis, the spring constant in the direction R can be set appropriately and freely within a wide range without decreasing the spring constants in the X-axis, Y-axis, and Z-axis directions to be lower than those of the conventional spring. As a result, this can prevent the spring 7 from being broken or sticking to another member.

In the same manner as the spring 1, each of the springs 2 to 7 described above can be applied to the mirror device, mirror array, optical switch, or the like described with reference to FIGS. 11 to 14.

As has been described above, according to this embodiment, since the total length of members with axes parallel to the pivot axis is set to be larger than the gap between the two ends of the spring in a no-load state, that is, larger than the length of the whole spring, the spring constant about the pivot axis can decrease, so that the spring constant in another direction does not decrease because of the layout and shapes of other members as well. Therefore, the spring can be formed easily to have desired characteristics.

In this embodiment, the members other than those parallel to the X-axis direction are formed parallel to the Y-axis direction or obliquely with respect to the X-axis and Y-axis directions. As far as the total length of the members parallel to the X-axis direction is larger than the spring length, or desirably larger than the total length of members other than those parallel to the X-axis direction, the spring can be set appropriately and freely such that its axis forms, for example, a curve, arc, or triangle. Although this embodiment is exemplified by a spring made of silicon, the constituent material of the spring is not limited to silicon. Various types of materials can be used as far as they are elastic materials such as, e.g., a metal or insulator.

The total length of the members parallel to the X-axis direction may be smaller than the total length of the members other than those parallel to the Y-axis direction, as far as it is larger than the spring length. A redundant arrangement that does not adversely affect the spring characteristics may be added as far as the total length of the members parallel to the X-axis direction is larger than the spring length.

The present invention can be applied to various types of devices, e.g., a micromachine manufactured by the MEMS technique, a semiconductor device, a wavelength selection switch, a scanner, an acceleration sensor, an angular velocity sensor, or the like having a member for connecting one member to another member. For example, when applying the present invention to a wavelength selection switch (Journal of microelectromechanical systems, vol. 15, NO. 5, October 2006, page 1209), the gaps among mirror devices must be very small. Therefore, desirably, the mirror devices can be arranged in a small-area region narrower than the gap among the mirror devices of a spring that constitutes a gimbal connector or mirror connector that supports a mirror. With the conventional serpentine-shaped spring, however, it is difficult to downsize the structure while providing desired characteristics. Hence, it is conventionally difficult to apply the present invention to a wavelength selection switch. In contrast to this, the spring structure of the present invention can be downsized while providing desired characteristics. Therefore, the present invention can be applied to a wavelength selection switch.

Alternatively, large springs can be arranged if they are placed such that the respective spring structures extend to the arrangement region of springs that support adjacent mirrors. In this case, it is difficult to satisfy the standard of reliability test such as vibration test. Hence, it is desirable to employ the spring of the present invention.

The invention claimed is:

1. A spring characterized by comprising:
    an elongated member including a pair of ends and made of an elastic material; and
    a plurality of bending portions which are formed between said pair of ends and divide said elongated member into a plurality of elements, wherein a total length of elements parallel to an axis extending through said pair of ends is larger than a gap between said ends in a no-load state.

2. A spring according to claim 1,
    characterized in that a length of said elements parallel to the axis is larger than a total length of elements not parallel to the axis.

3. A spring according to claim 1,
    characterized in that said elements include a linear shape.

4. A spring according to claim 1,
    characterized in that said spring has an almost H shape when seen from the top.

5. A spring according to claim 4, characterized by comprising
    a first element extending from one end thereof that constitutes one end of said spring for a first distance in one direction along an axial direction,
    a second element extending from one end thereof connected to the other end of said first element for a second distance in one direction along a perpendicular direction perpendicular to the axial direction,
    a third element extending from one end thereof connected to the other end of said second element for a third distance in the other direction along the axial direction,
    a fourth element extending from one end thereof connected to the other end of said third element for a fourth distance in one direction along the perpendicular direction,
    a fifth element extending from one end thereof connected to the other end of said fourth element for a fifth distance in one direction along the axial direction,
    a sixth element extending from one end thereof connected to the other end of said fifth element for a sixth distance in the other direction along the perpendicular direction,
    a seventh element extending from one end thereof connected to the other end of said sixth element for a seventh distance in the other direction along the axial direction,
    an eighth element extending from one end thereof connected to the other end of said seventh element for an eighth distance in the other direction along the perpendicular direction,
    a ninth element extending from one end thereof connected to the other end of said eighth element for a ninth distance in the other direction along the axial direction,
    a 10th element extending from one end thereof connected to the other end of said ninth element for a 10th distance in the other direction along the perpendicular direction,
    an 11th element extending from one end thereof connected to the other end of said 10th element for an 11th distance in one direction along the axial direction,
    a 12th element extending from one end thereof connected to the other end of said 11th element for a 12th distance in one direction along the perpendicular direction,
    a 13th element extending from one end thereof connected to the other end of said 12th element for a 13th distance in the other direction along the axial direction,
    a 14th element extending from one end thereof connected to the other end of said 13th element for a 14th distance in one direction along the perpendicular direction, and
    a 15th element extending from one end thereof connected to the other end of said 14th element for a 15th distance in one direction along the axial direction and including the other end that constitutes the other end of said spring.

6. A spring according to claim 5,
    characterized in that said first element and said ninth element, said second element and said eighth element, said seventh element and said 15th element, and said eighth element and said 14th element are spaced apart from each other.

7. A spring according to claim 5, characterized in that
    the second distance, the fourth distance, the sixth distance, the 10th distance, the 12th distance, and the 14th distance are equal to each other, and
    the eighth distance is twice the second distance.

8. A spring according to claim 5,
    characterized in that a sum of the second distance, the fourth distance, the 12th distance, and the 14th distance is equal to a sum of the sixth distance, the eighth distance, and the 10th distance.

9. A spring according to claim 5, characterized in that
    the second distance and the 14th distance are equal,
    the fourth distance, the sixth distance, the 10th distance, and the 12th distance are equal, and
    a sum of the second distance and the fourth distance is equal to the eighth distance.

10. A spring according to claim 1, characterized by comprising
    a first element extending from one end thereof that constitutes one end of said spring for a first distance in one direction along an axial direction,
    a second element extending from one end thereof connected to the other end of said first element for a second distance in one direction along a perpendicular direction perpendicular to the axial direction,
    a third element extending from one end thereof connected to the other end of said second element for a third distance in one direction along the axial direction,
    a fourth element extending from one end thereof connected to the other end of said third element for a fourth distance in the other direction along the perpendicular direction,
    a fifth element extending from one end thereof connected to the other end of said fourth element for a fifth distance in the other direction along the axial direction, a sixth element extending from one end thereof connected to the other end of said fifth element for a sixth distance in the other direction along the perpendicular direction, a seventh element extending from one end thereof connected to the other end of said sixth element for a seventh distance in the other direction along the axial direction, an eighth element extending from one end thereof connected to the other end of said seventh element for an eighth distance in the other direction along the perpendicular direction, a ninth element extending from one end thereof connected to the other end of said eighth element for a ninth distance in one direction along the axial direction, a 10th element extending from one end thereof connected to the other end of said ninth element for a 10th distance in one direction along the perpendicular direction, and an 11th element extending from one end thereof connected to the other end of said 10th element for an 11th distance in one direction along the axial direction and including the other end that constitutes the other end of said spring.

11. A spring according to claim 1, characterized by comprising a first element extending from one end thereof that constitutes one end of said spring for a first distance in one direction along an axial direction, a second element extending from one end thereof connected to the other end of said first element for a second distance in one direction along a perpendicular direction perpendicular to the axial direction, a third element extending from one end thereof connected to the other end of said second element for a third distance in the other direction along the axial direction, a fourth element extending from one end thereof connected to the other end of said third element for a fourth distance in one direction along the perpendicular direction, a fifth element extending from one end thereof connected to the other end of said fourth element for a fifth distance in one direction along the axial direction, a sixth element extending from one end thereof connected to the other end of said fifth element for a sixth distance in the other direction along the perpendicular direction, a seventh element extending from one end thereof connected to the other end of said sixth element for a seventh distance in one direction along the axial direction, an eighth element extending from one end thereof connected to the other end of said seventh element for an eighth distance in one direction along the perpendicular direction, a ninth element extending from one end thereof connected to the other end of said eighth element for a ninth distance in the other direction along the axial direction, a 10th element extending from one end thereof connected to the other end of said ninth element for a 10th distance in one direction along the perpendicular direction, and an 11th element extending from one end thereof connected to the other end of said 10th element for an 11th distance in one direction along the axial direction and including the other end that constitutes the other end of said spring.

12. A spring according to claim 1, characterized by comprising a first element extending from one end thereof that constitutes one end of said spring for a first distance in one direction along an axial direction, a second element extending from one end thereof connected to the other end of said first element for a second distance in one direction along a perpendicular direction perpendicular to the axial direction, a third element extending from one end thereof connected to the other end of said second element for a third distance in the other direction along the axial direction, a fourth element extending from one end thereof connected to the other end of said third element for a fourth distance in one direction along the perpendicular direction, a fifth element extending from one end thereof connected to the other end of said fourth element for a fifth distance in one direction along the axial direction, a sixth element extending from one end thereof connected to the other end of said fifth element for a sixth distance in the other direction along the perpendicular direction, a seventh element extending from one end thereof connected to the other end of said sixth element for a seventh distance in the other direction along the axial direction, an eighth element extending from one end thereof connected to the other end of said seventh element for an eighth distance in the other direction along the perpendicular direction, and a ninth element extending from one end thereof connected to the other end of said eighth element for a ninth distance in one direction along the axial direction and including the other end that constitutes the other end of said spring.

13. A spring according to claim 1, characterized by comprising a first element extending from one end thereof that constitutes one end of said spring for a first distance in one direction along an axial direction, a second element extending from one end thereof connected to the other end of said first element for a second distance in one direction along a perpendicular direction perpendicular to the axial direction, a third element extending from one end thereof connected to the other end of said second element for a third distance in the other direction along the axial direction, a fourth element extending from one end thereof connected to the other end of said third element for a fourth distance in one direction along the perpendicular direction, a fifth element extending from one end thereof connected to the other end of said fourth element for a fifth distance in one direction along the axial direction, a sixth element extending from one end thereof connected to the other end of said fifth element for a sixth distance in one direction along the perpendicular direction, a seventh element extending from one end thereof connected to the other end of said sixth element for a seventh distance in the other direction along the axial direction, an eighth element extending from one end thereof connected to the other end of said seventh element for an eighth distance in one direction along the perpendicular direction, a ninth element extending from one end thereof connected to the other end of said eighth element for a ninth distance in one direction along the axial direction, a 10th element extending from one end thereof connected to the other end of said ninth element for a 10th distance in the other direction along the perpendicular direction, an 11th element extending from one end thereof connected to the other end of said 10th element for an 11th distance in the other direction along the axial direction, a 12th element extending from one end thereof connected to the other end of said 11th element for a 12th distance in the other direction along the perpendicular direction, a 13th element extending from one end thereof connected to the other end of said 12th element for a 13th distance in one direction along the axial direction, a 14th element extending from one end thereof connected to the other end of said 13th element for a 14th distance in the other direction along the perpendicular direction, a 15th element extending from one end thereof connected to the other end of said 14th element for a 15th distance in the other direction along the axial direction, a 16th element extending from one end thereof connected to the other end of said 15th element for a 16th distance in the other direction along the perpendicular direction, a 17th element extending from one end thereof connected to the other end of said 16th element for a 17th distance in the other direction along the axial direction, an 18th element extending from one end thereof connected to the other end of said 17th element for an 18th distance in the other direction along the perpendicular direction, a 19th element extending from one end thereof connected to the other end of said 18th element for a 19th distance in one direction along the axial direction, a 20th element extending from one end thereof connected to the other end of said 19th element for a 20th distance in the other direction along the perpendicular direction, a 21st element extending from one end thereof connected to the other end of said 20th element for a 21st distance in the other direction along the axial direction, a 22nd element extending from one end thereof connected to the other end of said 21st element for a 22nd distance in the other direction along the perpendicular direction, a 23rd element extending from one end thereof connected to the other end of said 22nd element for a 23rd distance in one direction along the axial direction, a 24th element extending from one end thereof connected to the other end of said 23rd element for a 24th distance in one direction along the perpendicular direction, a 25th element extending from one end thereof connected to the other end of said 24th element for a 25th distance in the other direction along the axial direction, a 26th element extending from one end thereof connected to the other end of said 25th element for a 26th distance in the other direction along the perpendicular direction, a 27th element extending from one end thereof connected to the other end of said 26th element for a 27th distance in one direction along the axial direction, a 28th element extending from one end thereof connected to the other end of said 27th element for a 28th distance in one direction along the perpendicular direction, a 29th element extending from one end thereof connected to the other end of said 28th element for a 29th distance in the other direction along the axial direction, a 30th element extending from one end thereof connected to the other end of said 29th element for a 30th distance in one direction along the perpendicular direction, and a 31st element extending from one end thereof connected to the other end of said 30th element for a 31st distance in one direction along the axial direction and including the other end that constitutes the other end of said spring.

14. A spring according to claim 1, characterized by comprising a first element extending from one end thereof that constitutes one end of said spring for a first distance in one direction along an axial direction, a second element extending from one end thereof connected to the other end of said first element for a second distance in one direction along a perpendicular direction perpendicular to the axial direction, a third element extending from one end thereof connected to the other end of said second element for a third distance in the other direction along the axial direction, a fourth element extending from one end thereof connected to the other end of said third element for a fourth distance in one direction along the perpendicular direction, a fifth element extending from one end thereof connected to the other end of said fourth element for a fifth distance in one direction along the axial direction, a sixth element extending from one end thereof connected to the other end of said fifth element to a position axisymmetric with one end of said fifth element about a longitudinal direction of said first element, a seventh element extending from one end thereof connected to the other end of said sixth element for a seventh distance in one direction along the axial direction, an eighth element extending from one end thereof connected to the other end of said seventh element for an eighth distance in one direction along the perpendicular direction, a ninth element extending from one end thereof connected to the other end of said eighth element for a ninth distance in the other direction along the axial direction, a 10th element extending from one end thereof connected to the other end of said ninth element for a 10th distance in one direction along the perpendicular direction, and an 11th element extending from one end thereof connected to the other end of said 10th element for an 11th distance in one direction along the axial direction and including the other end that constitutes the other end of said spring.

15. A spring according to claim 1, characterized by comprising a first element extending from one end thereof that constitutes one end of said spring for a first distance in one direction along an axial direction, a second element disposed on one side direction along a perpendicular direction perpendicular to the axial direction of said first element and extending from one end thereof connected to the other end of said first element for a second distance to form a first acute angle with said first element, a third element extending from one end thereof connected to the other end of said second element for a third distance in one direction along the axial direction, a fourth element disposed on the other side direction along the perpendicular direction of said third element and extending from one end thereof connected to the other end of said third element for a fourth distance to form a second acute angle with said third element, a fifth element extending from one end thereof connected to the other end of said fourth element for a fifth distance in one direction along the axial direction, a sixth element disposed on a side of one direction along the perpendicular direction of said fifth element and extending from one end thereof connected to the other end of said fifth element for a sixth distance to form a third acute angle with said fifth element, and a seventh element extending from one end thereof connected to the other end of said sixth element for a seventh distance in one direction along the axial direction and including the other end that constitutes the other end of said spring.

16. A spring according to claim 1, characterized in that an element parallel to the axis is perpendicular to an element not parallel to the axis.

17. A mirror device including a substrate, a frame member disposed spaced apart from said substrate to be substantially parallel thereto, a mirror supported in an opening of said frame member to be pivotal through a spring, and an electrode formed at a position on said substrate to oppose said mirror, characterized in that said spring comprises an elongated member including a pair of ends and made of an elastic material, and a plurality of bending portions which are formed between said pair of ends and divide said elongated member into a plurality of elements, and a total length of elements parallel to an axis extending through said pair of ends is larger than a gap between said ends in a no-load state.

18. A mirror array characterized formed by two-dimensionally arranging a plurality of mirror devices each comprising a substrate, a frame member disposed spaced apart from said substrate to be substantially parallel thereto, a mirror supported in an opening of said frame member to be pivotal through a spring, and an electrode formed at a position on said substrate to oppose said mirror, characterized in that said spring comprises an elongated member including a pair of ends and made of an elastic material, and a plurality of bending portions which are formed between said pair of ends and divide said elongated member into a plurality of elements, and a total length of elements parallel to an axis extending through said pair of ends is larger than a gap between said ends in a no-load state.

19. An optical switch including a first mirror array which reflects light from an input port, and a second mirror array which reflects the light from said first mirror array and guides the light to an output port, characterized in that each of said first mirror array and said second mirror array comprises a mirror array formed by two-dimensionally arranging a plurality of mirror devices each comprising a substrate, a frame member disposed spaced apart from said substrate to be substantially parallel thereto, a mirror supported in an opening of said frame member to be pivotal through a spring, and an electrode formed at a position on said substrate to oppose said mirror, and said spring comprises an elongated member including a pair of ends and made of an elastic material, and a plurality of bending portions which are formed between said pair of ends and divide said elongated member into a plurality of elements, and a total length of elements parallel to an axis extending through said pair of ends is larger than a gap between said ends in a no-load state.

\* \* \* \* \*